US011862459B2

(12) United States Patent
Ohlsson et al.

(10) Patent No.: US 11,862,459 B2
(45) Date of Patent: Jan. 2, 2024

(54) SEMICONDUCTOR DEVICE HAVING A PLANAR III-N SEMICONDUCTOR LAYER AND FABRICATION METHOD

(71) Applicant: HEXAGEM AB, Hjarup (SE)

(72) Inventors: Jonas Ohlsson, Malmo (SE); Lars Samuelson, Malmo (SE); Kristian Storm, Hjarup (SE); Rafal Ciechonski, Lund (SE); Bart Markus, Hjarup (SE)

(73) Assignee: HEXAGEM AB, Hjarup (SE)

( * ) Notice: Subject to any disclaimer, the term of this patent is extended or adjusted under 35 U.S.C. 154(b) by 0 days.

(21) Appl. No.: 17/844,247

(22) Filed: Jun. 20, 2022

(65) Prior Publication Data

US 2022/0392766 A1 Dec. 8, 2022

Related U.S. Application Data

(62) Division of application No. 16/652,572, filed as application No. PCT/EP2018/077233 on Oct. 5, 2018, now Pat. No. 11,393,686.

(30) Foreign Application Priority Data

Oct. 5, 2017 (EP) .................................. 17195086

(51) Int. Cl.
*H01L 21/02* (2006.01)
*H01L 33/00* (2010.01)
(Continued)

(52) U.S. Cl.
CPC ........ *H01L 21/02378* (2013.01); *C30B 25/04* (2013.01); *C30B 25/183* (2013.01);
(Continued)

(58) Field of Classification Search
None
See application file for complete search history.

(56) References Cited

U.S. PATENT DOCUMENTS 6,252,261 B1 6/2001 Usui et al.
6,478,871 B1 * 11/2002 Shealy .............. H01L 21/02458
257/E21.113
(Continued)

FOREIGN PATENT DOCUMENTS

CN 101752487 A * 6/2010 ......... H01L 21/0242
CN 104733365 A * 6/2015 ............. C30B 25/18
(Continued)

OTHER PUBLICATIONS

Shresta et al., "A novel AlGaN/GaN multiple aperture vertical high electron mobility transistor with silicon oxide current blocking layer", Vacuum 118 (2015), pp. 59-63. (Year: 2015).*
(Continued)

*Primary Examiner* — Scott B Geyer
(74) *Attorney, Agent, or Firm* — THE MARBURY LAW GROUP PLLC

(57) ABSTRACT

A semiconductor device having a planar III-N semiconductor layer includes a substrate including a wafer and a buffer layer of a buffer material different from a material of the wafer, the buffer layer having a growth surface, an array of nanostructures epitaxially grown from the growth surface, a continuous planar layer formed by coalescence of upper parts of the nanostructures at an elevated temperature T, where the number of lattice cells spanning a center distance between adjacent nanostructures are different at the growth surface and at the coalesced planar layer, and a growth layer epitaxially grown on the planar layer.

4 Claims, 10 Drawing Sheets

(51) Int. Cl.
H01L 33/12 (2010.01)
H01L 33/16 (2010.01)
C30B 25/04 (2006.01)
C30B 25/18 (2006.01)
(52) U.S. Cl.
CPC ...... H01L 21/0242 (2013.01); H01L 21/0254 (2013.01); H01L 21/0262 (2013.01); H01L 21/0265 (2013.01); H01L 21/02381 (2013.01); H01L 21/02458 (2013.01); H01L 21/02502 (2013.01); H01L 21/02603 (2013.01); H01L 21/02647 (2013.01); H01L 33/007 (2013.01); H01L 33/12 (2013.01); H01L 33/16 (2013.01)

(56) References Cited

U.S. PATENT DOCUMENTS

| | | | |
|---|---|---|---|
| 8,143,630 | B2* | 3/2012 | Wang ............... H01L 21/02647 257/E33.001 |
| 9,275,857 | B1* | 3/2016 | Hersee ............... H01L 21/0254 |
| 9,558,942 | B1* | 1/2017 | Duriez ............. H01L 21/02603 |
| 9,722,135 | B2 | 8/2017 | Svensson et al. |
| 9,876,136 | B2 | 1/2018 | Lee et al. |
| 9,911,894 | B2 | 3/2018 | Ohmae et al. |
| 2002/0078881 | A1 | 6/2002 | Cuomo et al. |
| 2003/0180580 | A1* | 9/2003 | Wada ................ H01L 21/02639 257/E21.127 |
| 2009/0174038 | A1* | 7/2009 | Wang ...................... C30B 29/48 257/618 |
| 2010/0276665 | A1* | 11/2010 | Wang ............... H01L 21/02433 257/15 |
| 2011/0126891 | A1* | 6/2011 | Goto ................. H01L 27/14607 438/94 |
| 2011/0140072 | A1* | 6/2011 | Varangis ............. H01L 21/0262 977/762 |
| 2011/0175126 | A1 | 7/2011 | Yang et al. |
| 2011/0316000 | A1 | 12/2011 | Beaumont et al. |
| 2012/0091465 | A1 | 4/2012 | Krames et al. |
| 2012/0217474 | A1 | 8/2012 | Zang et al. |
| 2013/0075693 | A1 | 3/2013 | Svensson et al. |
| 2015/0014631 | A1* | 1/2015 | Ohlsson ............ H01L 21/02639 438/507 |
| 2015/0076450 | A1 | 3/2015 | Weman et al. |
| 2015/0280045 | A1 | 10/2015 | Bensaoula et al. |
| 2018/0277713 | A1* | 9/2018 | Ciechonski ......... H01L 21/0242 |
| 2020/0234946 | A1 | 7/2020 | Ohlsson et al. |

FOREIGN PATENT DOCUMENTS

| | | | | |
|---|---|---|---|---|
| JP | 2000-349338 | A | | 12/2000 |
| JP | 2003282447 | A * | 10/2003 | ............. C30B 25/02 |
| JP | 2006114829 | A * | 4/2006 | ......... H01L 21/0237 |
| JP | 2007-502546 | A | | 2/2007 |
| JP | 2008-162886 | A | | 1/2008 |
| WO | WO-2004079802 | A1 * | 9/2004 | ....... H01L 21/02389 |
| WO | WO2012075461 | A1 | | 6/2012 |
| WO | WO-2018073013 | A1 * | 4/2018 | ......... H01L 21/0242 |

OTHER PUBLICATIONS

Davos et al., "Pendeo-epitaxial growth of thin films of gallium nitride and related materials and their characterization", Journal of Crystal Growth 225 (2001), pp. 134-140. (Year: 2001).*

Z. R. Zytkiewicz, "Laterally overgrown structures as substrates for lattice mismatched epitaxy", Thin Solid Films 412 (2002), pp. 64-75. (Year: 2002).*

Linthicum et al., "Pendeoepitaxy of gallium nitride thin films", Appl. Phys. Lett. 75, (1999), pp. 196-198. (Year: 1999).*

Nam et al., "Lateral epitaxy of low defect density GaN layers via organometallic vapor phase epitaxy", Appl. Phys. Lett. 71 (1997), pp. 2638-2640. (Year: 1997).*

Bertness et al., "Controlled Nucleation of GaN Nanowires Grown with Molecular Beam Epitaxy", Adv. Funct. Mater. 20 (2010), pp. 2911-2915. (Year: 2010).*

Li et al., "Nanowire-Templated Lateral Epitaxial Growth of Low-Dislocation Density Nonpolar a-Plane GaN on r-Plane Sapphire", Adv. Mater. 21 (2009), pp. 2416-2420. (Year: 2009).*

Le et al., "Controlled Coalescence of AlGaN Nanowire Arrays: An Architecture for Nearly Dislocation-Free Planar Ultraviolet Photonic Device Applications", Adv. Mater. 28 (2016), pp. 8446-8454. (Year: 2016).*

Yeom et al., "Growth behavior of GaN epilayers on Si(111) grown by GaN nanowires assisted epitaxial lateral overgrowth", CrystEngComm 14 (2012), pp. 5558-5563. (Year: 2012).*

Dogan et al., "Formation of High-Quality GaN Microcrystals by Pendeoepitaxial Overgrowth of GaN Nanowires on Si(111) by Molecular Beam Epitaxy", Cryst. Growth Des. 11 (2011), pp. 4257-4260. (Year: 2011).*

Davis et al., "Review of Pendeo-Epitaxial Growth and Characterization of Thin Films of GaN and AlGaN Alloys on 6H-SiC(0001) and Si(111) Substrates", MRS Internet J. Nitride Semicond. Res. 6, 14 (2001), 12 pages. (Year: 2001).*

Thomson et al., "Ranges of deposition temperatures applicable for metalorganic vapor phase epitaxy of GaN films via the technique of pendeo-epitaxy", MRS Internet J. Nitride Semicond. Res. 4S1, G3.37 (1999), 6 pages. (Year: 1999).*

International Patent Application No. PCT/EP2018/077233, International Search Report, dated Mar. 1, 2019, 5 pgs.

Bougrioua et al., "Growth of Freestanding GaN Using Pillar-Epitaxial Lateral Overgrowth from GaN Nanocolumns," Journal of Crystal Growth, vol. 309, No. 2, Nov. 2007, pp. 113-120.

Hugues et al., "Strain Evolution in GaN Nanowires: From Free-Surface Objects to Coalesced Templates," Journal of Applied Physics, vol. 114, No. 8, Aug. 28, 2013, pp. 084307-084307-9.

Le et al., "Controlled Coalescence of AlGaN Nanowire Arrays: An Architecture for Nearly Dislocation-Free Planar Ultraviolet Photonic Device Applications," Advanced Materials, vol. 28, No. 38, Oct. 2016, pp. 8446-8454.

Sanchez-Paramo et al., "Structural and Optical Characterization of Intrinsic GaN Nanocolumns," Physica E—Low Dimensional Systems and Nanostructures, vol. 13, No. 2-4, Mar. 2002, pp. 1070-1073.

Japanese Patent Office Communication for Japanese Patent Application No. 2020-518780, dated Aug. 9, 2022.

Chen, X.J. et al., "Wafer-scale selective area growth of GaN hexagonal prismatic nanostructures on c-sapphire substrate," Journal of Crystal Growth, vol. 322, No. 1, (2011); DOI:10.1016/j.crysgro.2011.03.007.

Korean Patent Office Communication, Notice of Preliminary Rejection, for Korean Patent Application No. 10-2020-7010390, dated Sep. 5, 2022.

* cited by examiner

US 11,862,459 B2

SEMICONDUCTOR DEVICE HAVING A PLANAR III-N SEMICONDUCTOR LAYER AND FABRICATION METHOD

FIELD OF THE INVENTION

The present invention relates to III-nitride semiconductor substrates and methods for forming a planar surface on such substrates. More particularly, the invention relates to designs and processes for forming a planar surface of a c-oriented, fully relaxed and dislocation-free, III-nitride material, suitable to serve as a template for carrying electronic or optical components.

BACKGROUND

Semiconductor wafers are typically fabricated by liquid phase epitaxy, most often the Czochralski-method, already invented in 1916 by Jan Czochralski. In the Czochralski-process thermally induced precipitation of liquid state material to a solid state crystal is realized by slowly pulling a monocrystalline seed from a hot liquid melt.

While epitaxial growth requires a certain deviation from thermal equilibrium in order to drive continuous crystallization, LPE is carried out at the verge of thermal equilibrium, the main enabler being the similar density of the liquid and the solid state crystal, eliminating diffusion-limitations dominating vapor phase epitaxy where the source material is comparatively dilute in the non-crystalline phase and allowing a minimal deviation from the melting temperature to instigate crystal growth. When the temperature of the system is uniform and the system is in equilibrium the atomic sticking-rate (rate of precipitation) equals the atomic dissociation rate. "Perfect Crystal" growth-conditions above are established when the incorporation of adatoms at crystal lattice sites offer a sufficiently higher decrease in free energy than the incorporation of adatoms at positions of interstitials and vacancies [See Handbook of crystal growth IA Chapters 2 and 8]. In contrast, growth methods far away from thermal equilibrium, such as metal organic vapour phase epitaxy (MOVPE or MOCVD), epitaxial growth is largely limited and governed by the diffusion of source material to the crystal surface and the energy difference between atomic incorporation at perfect lattice sites versus an interstitial site or the creation of a vacancy are insignificant.

The Czochralski-process is the predominantly used method for fabrication of semiconductor wafers used by the semiconductor industry and crystal growth by a liquid/solid phase transition, liquid phase epitaxy (LPE), is still the only established method for fabrication-method of high perfection large diameter semiconductor crystal wafers, be it Si, Ge, GaAs, GaP, or InP semiconductors [Handbook of Crystal Growth IIA, Chapter 2]. Crystal defects, such as impurities, vacancies and crystal dislocations can, already at extremely low concentrations, deteriorate electrical and optical properties of the semiconductor. Over hundred years there is little that has changed within the basic fabrication of semiconductor material and the designation of Jan Czochralsiki as "The father of Semiconductor technology" is as valid today as it was then.

The group of binary III-V semiconductors comprising GaN, AlN, InN and their ternary and quaternary alloys are usually simply referred to as "nitrides". The nitrides are unique in their span of properties and potential use. Based on theoretical properties alone, the nitrides comprise the most efficient semiconductor alternatives for high power, radio frequency, and the only viable alternative for true RGB white light-sources and short wavelength LEDs and Lasers from violet through UV. They are, however, also unique in being the only commonly used semiconductors where LPE isn't used to produce wafers. Instead they are usually fabricated by mismatched growth on other crystal substrates, such as SiC, Sapphire and Si wafers. This is unfortunate, since the mismatched crystal growth generates high densities of crystal dislocations, The predominant challenge for making high perfection semiconductor nitrides is the inability to establish epitaxial conditions close to thermal equilibrium. This is a result of the impossibility to create and contain liquid GaN. The melting point of GaN has been known to be high but it was not until recently that work showed the conditions needed to form congruent GaN melt, at 6 Gigapascal (GPa) and a temperature of 2700° C. [Utsumi et al., Nature Materials, 2, 235, 2003].

Alternative methods for fabricating bulk GaN have been developed, such as ammonothermal growth, solution based growth and HVPE, each with their own advantages [Technology of GaN Crystal Growth, Ehrentraut, Meissner and Bockowski, Springer, 2010]. While they all and together represent great strides forward to an extremely challenging system, they all rely on transport mechanism and comes short of the previously discussed ideal equilibrium conditions of a pure liquid-solid system where the similar density of the liquid and solid phase ensures immediate access to growth species at the growth site, unrestricted by diffusion. Nowadays, there are commercially available small sized bulk GaN, having dislocation densities lower than 10E5 $cm^{-2}$, although at very high price levels and limited quantities.

Epitaxial growth of nitride device layers, are generally carried out by MOCVD. Modern MOCVD reactors are able to accommodate multiple 8" wafers in one run and sustains LED market through GaN/InGaN blue LEDs, and certain niches of power and RF electronics through AlGaN/GaN HEMT structures. In all but the most esoteric application, the base GaN layers and device layers are grown in a single MOCVD-sequence, on foreign substrates, SiC, Sapphire or Si. These substrates are all different from GaN in crystal structure and lattice-size with the introduction of misfit induced lattice dislocations penetrating the device layers as an inevitable consequence.

For various types of electronic devices, such as HEMT (high electron mobility transistor) or HFET (heterojunction field effect transistor) structures, III-nitride materials such as Gallium nitride (GaN) material have superior properties with regard to e.g. electron mobility (speed, efficiency) and high voltage ability than both Si-based materials. However, GaN technology generally entail higher cost than Si technology, and is often inferior in material quality and high voltage reliability compared to e.g. SiC technology. This due to the use of foreign substrates necessitated by inability to fabricate sufficient production levels of GaN native substrates at commercially viable cost levels, and to the fact that no alternative substrate material has properties compatible with the growth of III-nitrides. Thus, major limits of GaN electronics technology boil down to material crystal dislocations and wafer production cost, related to minimization of dislocations originating from growth on foreign substrates, such as SiC.

Various solutions to these problems were suggested by one of the instant inventors in the U.S. patent application Ser. No. 14/378,063, published as US2015/0014631, the content of which is incorporated herein in its entirety by reference. In that application, a method for making a semiconductor device was described, including steps for forming a plurality of semiconductor nanowires over a substrate through an insulating growth mask located over a substrate, forming a semiconductor volume element on each nanowire, planarizing each volume element to form a plurality of discreet III-nitride semiconductor mesas having substantially planar upper surfaces, and forming a device in each of the plurality of base elements. Each mesa has a substantially planar c-plane {0001} upper surface. The device may also include at least one electrode located over each semiconductor mesa. The process for planarizing grown III-nitride elements is proposed to include in situ etch back of a pyramidical structure, as obtained at the volume growth, by etching or polishing, to form a wide c-plane parallel to the substrate.

SUMMARY OF THE INVENTION

Various embodiments within the scope of the invention are defined in the claims. Other objects, advantages and novel features of the invention will become apparent from the following detailed description of the invention when considered in conjunction with the accompanying drawings and claims.

According to one aspect, a method is provided for fabricating a semiconductor device having a planar III-N semiconductor layer, comprising
providing a substrate comprising a wafer, a buffer layer of a different material than the wafer and having a growth surface, and a mask layer on the growth surface, having an array of nanosized apertures;
epitaxially growing a III-N material in the apertures to form nanostructures, such that threading dislocations divert away from a growth front normal to the growth surface;
coalescing upper parts of the nanostructures at an elevated temperature T to form a continuous planar layer;
epitaxially growing a III-N growth layer on said planar layer;
wherein the growth layer is configured such that thermal expansion between RT and T of the growth layer is greater than thermal expansion of the substrate when the crystal lattice spacing parallel with the growth surface is smaller in the growth layer than at the growth surface of the buffer layer, and
lesser than thermal expansion of the substrate when the crystal lattice spacing parallel with the growth surface is larger in the of the growth layer than at the growth surface of the buffer layer.

The mask layer may be removed in subsequent steps, e.g. by etching under influence of an electric field or current.

In one embodiment, a nominal lattice constant of the growth layer is adapted by composition configuration of a III-N material in the growth layer.

In one embodiment, T>the sublimation temperature of the III-N material of the nanostructures.

In one embodiment, the growth layer is grown to a thickness of >3 μm, or >5 μm, or >7 μm, or >10 μm. The growth layer Growth lay may comprise sublayers of varying composition of e.g. different III-N materials.

In one embodiment, the nanostructures comprise GaN.
In one embodiment, the growth layer comprises AlGaN.
In one embodiment, the wafer comprises sapphire.
In one embodiment, the growth layer includes AlGaN, where Al is comprised to >20% of the III materials Ga and Al, or >30% or >40%.

In one embodiment, the growth layer includes AlGaN, where Al is comprised to >45% of the III materials Ga and Al.

In one embodiment, the growth layer comprises InGaN.
In one embodiment, the wafer comprises Si or SiC.
In one embodiment, the upper part of the nanostructures starts between 0 and 200 nm above the mask. The upper part may be defined as a top region of a nanostructure comprising a nanowire.

In one embodiment, the nanostructures include nanowires, grown through said apertures.

In one embodiment, the step of coalescing the upper part of the nanostructures includes providing a background flow of a nitrogen source.

In one embodiment, the step of coalescing involves adding a III-N material between the nanostructures, including an amount of III material which exceeds an amount of III material provided by a source flow of III-material.

In one embodiment, the step of coalescing involves forming III-N material between the nanostructures without a source flow of III-material.

In one embodiment, >90% of the upper parts of the nanostructures are free from threading dislocations. In other embodiments to 99% of the upper parts of the nanostructures are free from threading dislocations, and with decreasing aperture size in the mask, the nanostructures will asymptotically become dislocation free.

In one embodiment, the step of coalescing includes
releasing column III material from the upper ends of the nanostructures;
filling out a spacing between upper parts of m plane facets of the nanostructures, by forming semiconductor material from the released column III material.

In one embodiment, the step of coalescing includes;
leaving a void, not filled with semiconductor material, between the semiconductor structures at lower parts of the m plane facets, adjacent the growth surface.

In one embodiment, said aperture size is <150 nm, and/or a spacing between adjacent apertures is <2.5 μm.

In one embodiment, thermal expansion of the wafer from RT to T affects built-in crystal strain in the buffer layer and causes an increase in said crystal lattice spacing at the growth surface to deviate from a corresponding increase of a relaxed crystal of the buffer material;
wherein the number of lattice cells spanning the distance between adjacent apertures are different at the growth surface and at the coalesced planar layer.

In one embodiment, the coalesced planar layer has a mean lattice spacing corresponding to it being formed at the elevated temperature, T, with the nominal lattice spacing of an essentially relaxed III-N crystal of the buffer layer material.

According to a second aspect, a semiconductor device having a planar III-N semiconductor layer is provided, comprising
a substrate comprising a wafer and a buffer layer, of a different material than the wafer, having a growth surface;
an array of nanostructures epitaxially grown from the growth surface;
a continuous planar layer formed by coalescence of upper parts of the nanostructures at an elevated temperature T;
a growth layer, epitaxially grown on the planar layer;
wherein crystal lattice spacing parallel with the growth surface is smaller in the growth layer than at the growth surface of the buffer layer; and wherein the growth layer is configured such that thermal expansion between RT and T is greater for the growth layer than for the substrate.

In one embodiment, the device is characterized in accordance with any of the preceding embodiments.

According to a second aspect, a semiconductor device having a planar III-N semiconductor layer is provided, comprising
- a substrate comprising a wafer and a buffer layer, of a different material than the wafer, having a growth surface;
- an array of nanostructures epitaxially grown from the growth surface;
- a continuous planar layer formed by coalescence of upper parts of the nanostructures at an elevated temperature T;
- a growth layer, epitaxially grown on the planar layer;
- wherein crystal lattice spacing parallel with the growth surface is larger in the growth layer than at the growth surface of the buffer layer (102); and
- wherein the growth layer is configured such that thermal expansion between RT and T is lesser for the growth layer for the wafer.

The growth layer may have a planar upper surface. In various embodiments, the semiconductor device may comprise an electrical and/or optical component, formed on the upper surface of the growth layer.

In one embodiment, the electronic device is further characterized in accordance with any of the preceding claims embodiments.

In one embodiment, the number of lattice cells spanning the distance between adjacent apertures are different at the growth surface and at the coalesced planar layer.

In one embodiment, the coalesced planar layer has a mean lattice spacing corresponding to it being formed at the elevated temperature, T, with the nominal lattice spacing of an essentially relaxed III-N crystal of the buffer layer material.

According to a fourth aspect, a semiconductor device having a planar III-N semiconductor layer is provided, comprising
- a substrate comprising a wafer and a buffer layer of a buffer material different from a material of the wafer, the buffer layer having a growth surface;
- an array of nanostructures epitaxially grown from the growth surface;
- a continuous planar layer formed by coalescence of upper parts of the nanostructures at an elevated temperature T, wherein the number of lattice cells spanning a center distance between adjacent nanostructures are different at the growth surface and at the coalesced planar layer;
- a growth layer, epitaxially grown on the planar layer. The planar layer may be of the same III-N material as the buffer material.

BRIEF DESCRIPTION OF THE DRAWINGS

Preferred embodiments of the invention will now be described with reference to the accompanying drawings.

DETAILED DESCRIPTION

Figure 1:
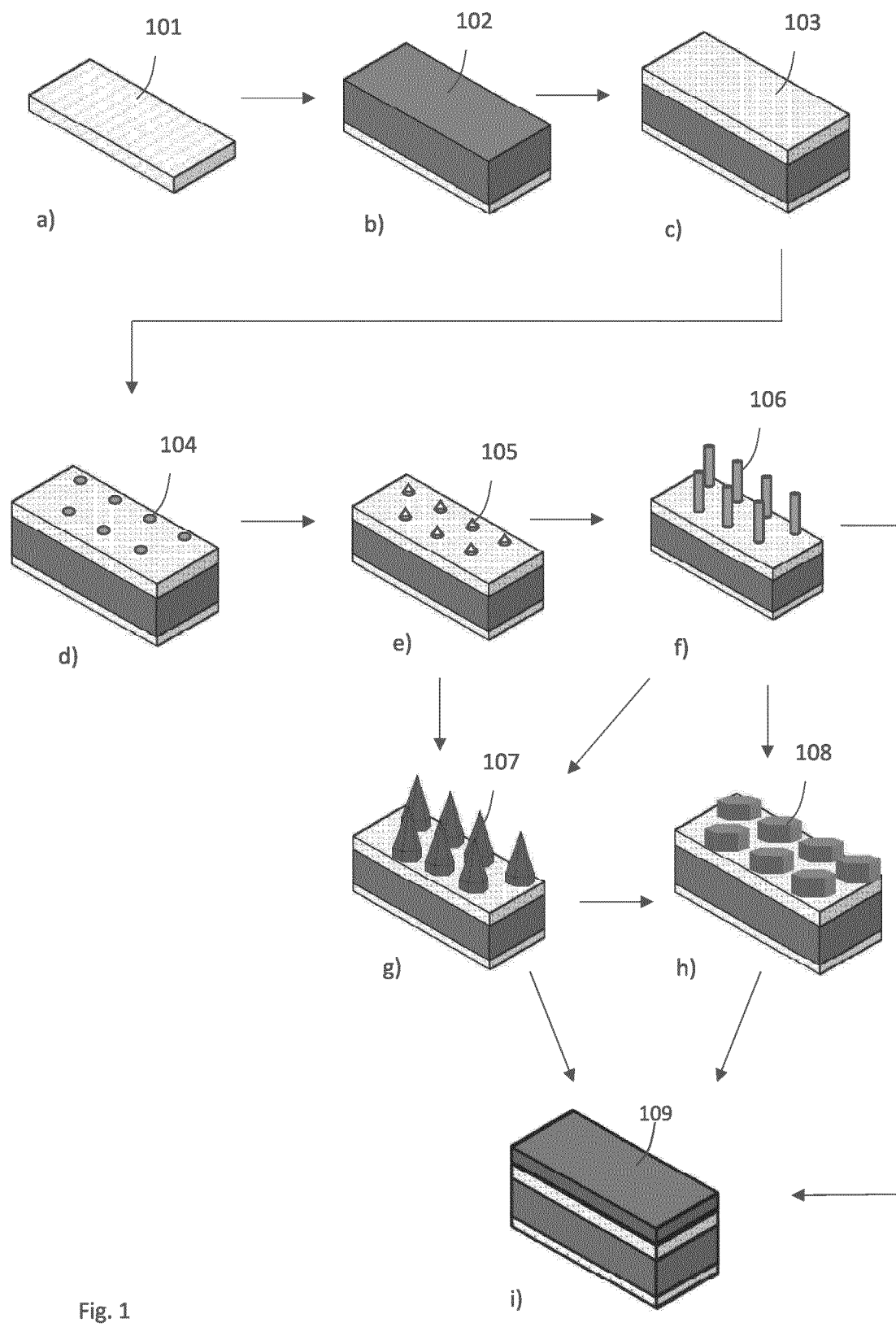
FIG. 1 schematically illustrates various devices and steps of a production process for a III-nitride semiconductor device according to different embodiments.

Certain embodiments of the invention relate to methods of making a III-nitride semiconductor device. This III-nitride material may e.g. be GaN, InGaN (Indium Gallium nitride), or AlGaN (Aluminum Gallium nitride). The method may comprise forming a plurality of semiconductor seeds over a substrate. The substrate may be any suitable material for growing III-nitride seeds or nanowires, for example a GaN, silicon, SiC, sapphire or AlN wafer which may optionally contain one or more buffer layers, such as a GaN buffer layer on a silicon substrate. For homogeneous fabrication of GaN wafers and arrays the basic atomic information the substrate material provides to the process is a uniform crystal orientation to all seeds and a competitive surface for selective nucleation of GaN. Such a surface may be provided through thin films, such as graphene, ALD-fabricated oxides and LPCVD-fabricated AlN. In various embodiments, the seeds are continuously grown to nanowires. In various embodiments, a semiconductor volume element is grown on each seed or nanowire. In a planarizing step, a plurality of discrete templates, or base elements, having a substantially planar upper surface, are formed. After planarizing, a step of c-plane surface repair growth may also be performed. Subsequent steps may include forming a device, such as an electronic component, in or on each of the plurality of base elements.

As will be discussed, the planarizing step is most appropriately also called a reformation-step. It's our understanding that the large-scale homogeneity seen in the reformation step discussed herein is enabled by homogeneous crystal structure of the dislocation-free crystal templates used. Hitherto, the only known way to provide such an array of dislocation-free templates is through selective NW-growth.

Furthermore, a fundamental level it is understood that the dislocation-free nature of the array is dependent on combination of the aperture dimension of the opening in the mask and the specific epitaxial growth conditions. NW growth conditions are no magic bullet but has been shown to provide such dislocation-free crystals. Since the generation of dislocation-free crystals is the prominent task of the NW growth step and, for the purpose of this application, any epitaxial conditions that provides such monocrystalline templates are considered to be NW-conditions.

Different embodiments will now be discussed with reference to the drawings. It shall be noted that reference is made to certain examples of devices and methods, where materials and process parameters of working embodiments are given. This does not, as such, mean that certain steps or features may be of a different character or art without departing from the general scope of the solutions proposed herein, and which fall within the scope of the appended claims. In addition, more details related to e.g. nanowire growth in III-nitride materials are available to the skilled person in e.g. the above-referenced prior application.

FIG. 1 schematically illustrates method step of the production of a III-nitride semiconductor device. In a step a) a base substrate 101 of e.g. sapphire is provided. In a step b) one or more layers 102 of e.g. GaN are formed on the base substrate 101. Together, the layers 101 and 102 form a substrate. In a step c) a mask layer 103 of e.g. $SiN_x$ may be formed on top of the substrate. In a subsequent step d), holes 104 are provided in the mask layer 103, e.g. by means of EBL (electron beam lithography). The holes may be very narrow, e.g. with a diameter of 50-150 nm, or 60-100 nm. The pitch between the holes 104 may e.g. be in the order of 200-2000 nm, and is selected dependent on inter alia the electronic devices to be formed on the templates which are to be created on the substrate, and may also depend on the material of the III-nitride. In a step e) growth of a first III-nitride material is performed or at least initiated. Step e) indicates the initial growth, in the form of substantially pyramidal seeds 105, protruding from the holes 104. In a subsequent step f), which need not be included in all embodiments, as will be explained, the seeds 105 are grown into nanowires 106, by continued growth of the III-nitride material of the seeds 105, e.g. by CVD or VPE in a nanowire growth step, wherein a nitrogen source flow and a metal-organic source flow are present. In an embodiment including growth of nanowires as in step f), the process from d) to f) is typically continuous.

In one embodiment, the seed 105 and subsequently grown nanowires 106 comprise GaN. By growth from holes 104, which represent a very small portion of the substrate surface, a large majority of any dislocations in the substrate III-nitride 102 are filtered out. In addition, dislocations close to the edge of a hole 104 tend to bend off towards one side of the grown nanowire 106. Nanowires of GaN are thus grown, normally in a hexagonal shape with 6 equivalent and smooth m-plane facets, where dislocations are seen to terminate towards the $SiN_x$ mask. The result is entirely or substantially dislocation free seeds 105 or nanowires 106 of GaN, e.g. to a degree of at least 90% or at least 99% of the seeds 105 or nanowires 106 being dislocation free.

A nitride semiconductor nanowire 106 as discussed herein is in this context defined as an essentially rod-shaped structure with a diameter less than 1 micron, such as 50-100 nm and a length up to several μm. The method of growing nitride semiconductor nanowires according to one non-limiting embodiment of the invention utilizes a CVD based selective area growth technique. A nitrogen source and a metal-organic source are present during the nanowire growth step and at least the nitrogen source flow rate is continuous during the nanowire growth step. The V/III-ratio utilized for nanowire growth is significantly lower than the V/III-ratios commonly associated with the growth of nitride based semiconductor, as also outlined in the referenced earlier US application.

For an embodiment of GaN, processing according to g) of FIG. 1 may continue. Here, a GaN volume element 107 is grown on each nanowire 106. This step of forming the volume element 107 on the nanowires 106 may be carried out by CVD or VPE in a volume element growth step, wherein the nitrogen source flow and the metal-organic source flow are present. Preferably, the molar V/III-ratio during the volume element 107 growth step is higher than the molar V/III-ratio during the nanowire growth step. The volume element 107 grows to comprise a discreet insulating or semi-insulating GaN pyramid formed around each GaN nanowire 106.

In an alternative embodiment, processing according to step g) of FIG. 1 may be performed from the seed stage of e), without fully growing nanowires 106, as indicated by the vertical arrow in the drawing between steps e) and g). Also this step of growing a GaN volume element 107 on seeds 105 may be carried out by CVD or VPE in a volume element growth step, wherein the nitrogen source flow and the metal-organic source flow are present. Preferably, the molar V/III-ratio during the volume element 107 growth step is higher than the molar V/III-ratio during the seed growth step. The volume element 107 grows to comprises a discrete insulating or semi-insulating GaN pyramid formed around each GaN seed 105. Further details related to volume growth may also be obtained e.g. from the referenced US application by the instant inventor.

The process also includes a planarizing step. This may be carried out either after a nanowire growth step f), or alternatively after a volume element 107 growth step g), as indicated in FIG. 1.

In one embodiment, in which a GaN growth of nanowires 106, and potentially also a GaN volume element 107, is subjected to planarizing to obtain a flat c-plane mesa 108 as shown in h), the inventors have discovered the surprising effect that, by carefully selecting process parameters, the planarization can be performed without, or at least without any significant, desorption of GaN. In such an embodiment, the planarization is instead obtained by controlled atomic redistribution of the nanostructure, i.e. the nanowire 106 when planarizing from f) to h), or the volume element 107 when planarizing from g) to h). Such a step may be carried out by providing a high, or even very high, flow of Nitrogen-containing material, typically $NH_3$, while throttling, or preferably completely omitting, supply of additional flow of Ga source material. In other words, no or substantially no new Ga atoms are supplied. In one embodiment, the flow of $NH_3$ may e.g. be in the order of 5-20, in certain embodiments within 9-10 slm, while the Ga source is completely shut off. The process temperature may be maintained as held in a receding volume growth step, or be elevated, e.g. in the range of 1000-1200 degrees Celsius for GaN (the range going down to 700 for InGaN growth and up to 1500 for AlGaN growth). The inventors have found that the research results indicate that by selecting suitable process conditions, Ga atoms may break their crystal bond, without actually being completely desorbed and leave the GaN crystal surface. Instead, single Ga atoms may still be physically attached, even if the chemical bond is broken, herein referred to as physisorbed. Such a physisorbed Ga atom may travel on the surface of the GaN device, and reattach at another place. More specifically, given the right conditions, such as exemplified, a cone of a volume growth or element 107 may grow in the normal direction to the slanting s-plane, such that vertical m-planes underneath, and the planar top c-plane, increase. By providing the high $NH_3$ flow, or back pressure, while the temperature is optimally elevated, sufficient mobility of physisorbed Ga atoms is obtained, while excessive dissociation is avoided, such that the described atomic redistribution may be obtained. The process temperature at the planarizing step should preferably still be kept below a certain upper level, for the purpose of avoiding a three phase system where liquid Ga may form droplets on the surface of the GaN device.

Figure 2A:
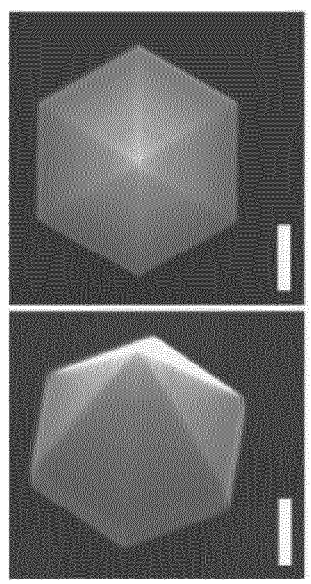
FIGS. 2A and B illustrate embodiments of different stages of a GaN device in production.
Figure 2B:
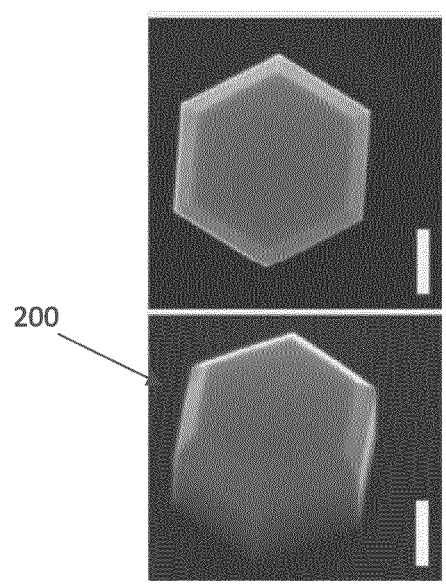

Exemplary test results are depicted in FIG. 2, where FIG. 2A shows a substantially cone-shaped or pyramidal GaN device as created by volume growth 107. FIG. 2B illustrates the transformation of a device of FIG. 2A, when subjected to planarization by atomic redistribution, as described. Evidently, the m-planes and the c-plane have increased, while the s-plane has decreased. The result is, inter alia, that an enlarged c-plane has been obtained, usable for providing e.g. epitaxial layers or other provision of contacts etc. Still, the decreased or even eliminated degree of dislocations in the GaN surface as obtained by mask growth, is maintained. In other words, the average amount of dislocations per surface area unit is substantially lower, ideally nil, as compared to an epitaxially grown continuous GaN surface, such as layer 102. Furthermore, the increase of the c-plane in the planarization step can be obtained in situ, without removal of the substrate from the machine after nanowire and potential volume growth, and without involvement of other material, such as etchants. This way, process speed and reliability may be improved. Test results have also shown that in one embodiments, atomic reconstruction may be carried out under circumstances such that mobile physisorbed Ga atoms will rather attach on the m-plane than on the c-plane. In such an embodiment, the results of the in crystal reconstruction involves the effect that a wider c-plane may be, which is usable for component configuration, than for a pure etching or polishing process.

In one embodiment, the suggested process is applied for an InGaN device. In such a process, steps a) to d) are also included. In one variant, the substrate layer 102 may also include an InGaN layer, on which a seed 105 and subsequently a nanowire 106 is grown of InGaN. Volume growth of InGaN is then carried out, on the InGaN nanowire 106, in step g). In an alternative embodiment, which has provided more reliable lab results, the process from a) to e) is the same as for GaN, i.e. with GaN seed growth on a GaN substrate layer 102. However, the GaN growth is stopped at the seed stage, preferably when the seed 105 is only a small pyramid, preferably with no m-plane over the mask level. After that, volume growth of InGaN is applied onto the GaN seed 105, to the state of a pyramid volume as in g). By starting with GaN growth, a lower level of dislocations may potentially be provided in the seed 105. In addition, by providing volume growth of InGaN already on the small seed 105 of GaN, rather than on a GaN nanowire, the risk for dislocation errors in the volume growth is minimized.

Figure 3A:
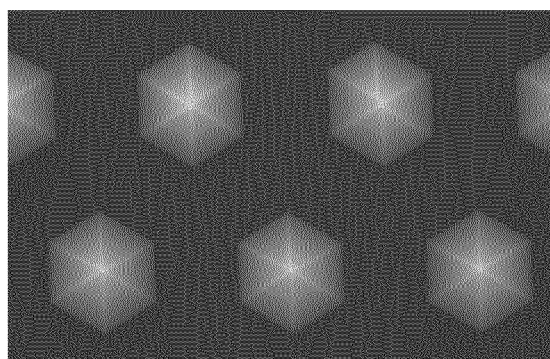
FIGS. 3A-C illustrate embodiments of different stages of an InGaN device in production.
Figure 3B:
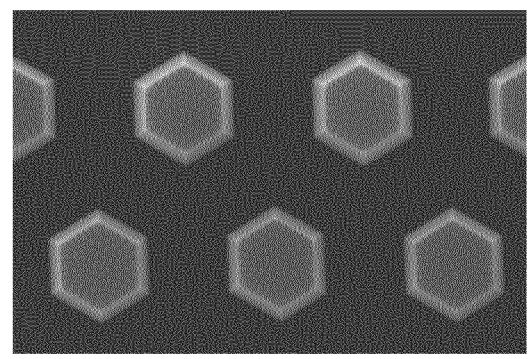

In the planarizing step from g) to h) of an InGaN volume 107 at an elevated temperature, a high degree of dissociation is normally involved, and may be dominating over any atomic redistribution. FIG. 3A illustrates an InGaN volume device 107, and although this is only a top view, its pyramidal shape is evident. FIG. 3B shows such volume device after planarizing, e.g. at a temperature in the range of 1100-1200 degrees Celsius, with a high $NH_3$ flow of 5-10 slm and absent any additional provision of In or Ga during the planarizing step. Also in this case, the planarization is obtained without providing any etchants, and c-plane increase is also obtained without any minimization of the width of the devices. As can be seen, though, a pattern of trenches may occur in the c-plane surface, potentially caused by the different boiling temperature of In and Ga. In a preferred embodiment, a repair step of providing additional InGaN growth may therefore be carried out, after planarization. When doing so, pyramidal growth will again occur, as during the preceding volume growth step from e) to g).

Figure 3C:
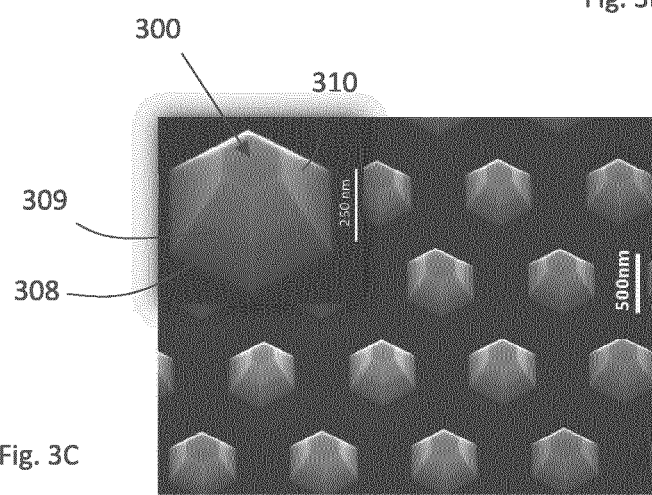

However, only a limited number of atomic layers are required, and after that, further epitaxial growth may be carried out to form electrical components, e.g. red and green light-emitting diodes. FIG. 3C shows a slanted image of such a device 300, where the planarized InGaN body 308 forms the base part, additional InGaN repair layers 309 are provided thereon, and epitaxial component layers 310 are formed on the repair layers 309.

Figure 4:
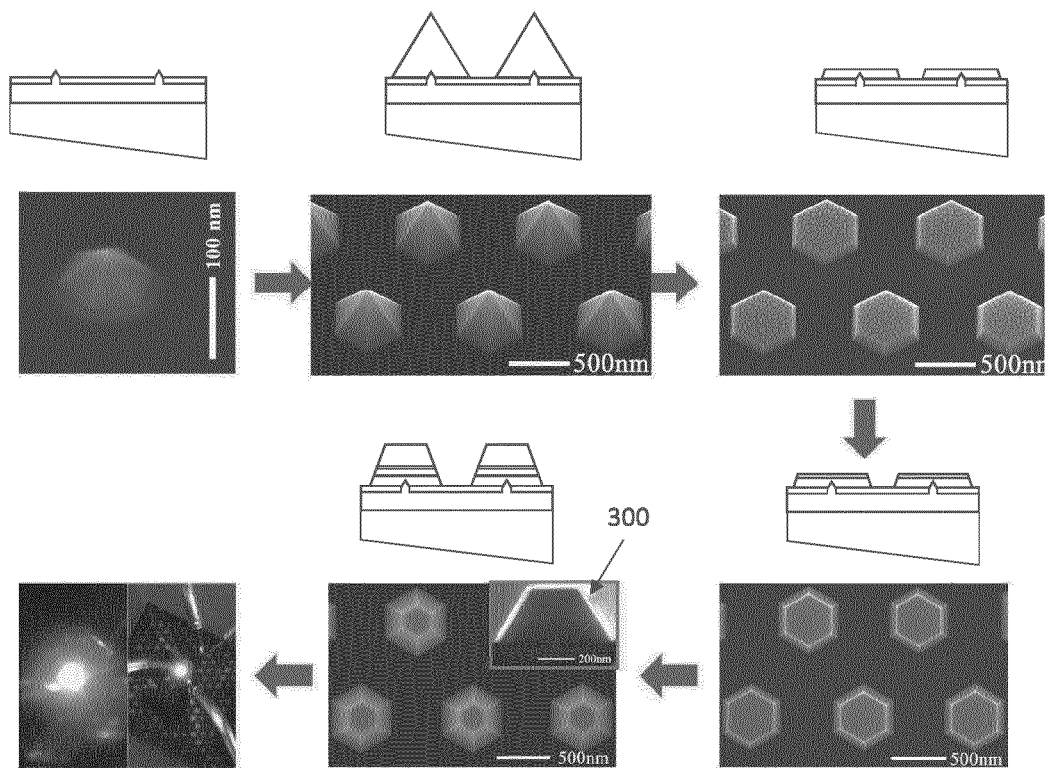
FIG. 4 schematically illustrate process steps of a production process of an InGaN-based light-emitting component.

Also FIG. 4 illustrates the process of manufacturing a light emitting diode on an InGaN device as described with reference to the preceding description and drawings, starting from a GaN seed. In the middle lower picture of FIG. 4, the side view of device 300 also clearly shows the layers 308, 309, and 310.

Figure 5:
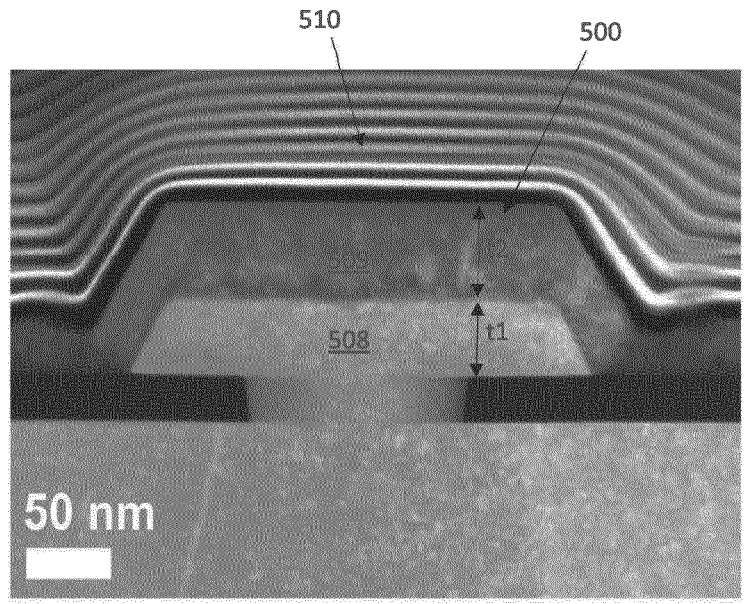
FIG. 5 shows a side view of an AlGaN device with further epitaxial layers built on top.

In one embodiment, the general growth process incorporating planarization is employed for the production of AlGaN devices. One such device 500 is shown in a side cross-section view in FIG. 5. The high degree of reactivity of Al with other materials presents a hurdle for growing AlGaN from mask holes, since the Al may grow on the mask too. For this reason, the inventors have come up with a new way of manufacturing planar AlGaN templates, on which to provide further epitaxial growth for component production. Referring back to FIG. 1, the process steps from a) to f) are carried out with GaN, for the beneficial reasons already referred to with regard to elimination or minimization of dislocations. (The process may alternatively be halted already at the seed level of e), dependent inter alia on hole size and on how large GaN planar mesas are desired.) After a plurality of GaN nanowires 106 (or seeds 105) have been grown to contain desired volume, a planarizing step is carried out at h). In other words, there is preferably no volume step g) involved in the AlGaN process.

The result after atomic distribution as described above for GaN, will be a flat mesa 508 with a relatively small diameter, e.g. compared to the hole, since there is much less material in the growth when no volume growth step has been carried out. As an example, for a mask hole 104 size of 60-100 nm, the planarized GaN mesa structure 508 may have a width of 200-300 nm, i.e. in the range of only e.g. 2-5 times the mask hole size. In addition, the flat GaN structure will be configured, by atomic redistribution, to be very thin, e.g. with a GaN thickness t1 in the range of 30-100 nm.

In a subsequent process step, AlGaN growth is begun. As noted, layers may then grow on all parts of the substrate and on all facets of the flat GaN mesas. More importantly, AlGaN growth is deliberately continued until a layer 509 having a relatively large thickness t2, compared to t1. The reason for this is that any plastic deformation, as caused by the lattice mismatch between GaN and AlGaN, will occur in the GaN layer 508 rather than in the AlGaN layer 509. So, rather than a thin AlGaN layer 509 stretching to adapt to the crystal structure of the GaN mesa layer 508, a relatively thick AlGaN layer 509 will compress or contract the GaN layer 508, in the region of the interface between the materials. The growth of AlGaN layer 509 shall preferably be carried out at a comparatively low temperature, for AlGaN growth, which will help retain template shape at subsequent higher temperatures when adding layers over layer 509. The result is a substantially or entirely dislocation free AlGaN layer, on which further epitaxial layers 510, contacts or other component structures may be built.

In various embodiments, incorporating any one of the above-referenced embodiments and materials, the process may involve epitaxially growing a semiconductor displacing layer on the planarized volume element such that an upper surface of the displacing layer is located above the upper tip of the nanowire or seed, and the upper surface of the displacing layer forms the upper surface of each of the base elements, or alternatively that planarizing is halted at a stage where said tip is still below the upper c-plane layer of the planarized device.

Referring back to FIG. 1, in one aspect of the invention, a planarizing step is carried out to reform and merge or unite adjacent nanowire of volume growths. This is schematically illustrated through step i) of FIG. 1. This may be carried out either after a nanowire growth step f) or after a volume element 107 growth step g), and can be seen as a continued planarizing step via stage h). The result is a continuous planar semiconductor layer or film 109, obtained from a plurality of separate growths. This process is referred to herein as coalescing.

As an example, a planar GaN layer may be obtained by coalescing. In one embodiment, GaN nanowire growth may be obtained using standard precursors TMG, TEG, NH3 and nitrogen and hydrogen carrier gases, on a patterned substrate, with a thin mask layer 103—silicon nitride, silicon dioxide or similar. Openings 104 in the mask can be done by the standard lithographic techniques like nanoimprint or electron beam lithography, and developed using dry etching techniques like ICP-RIE and wet chemical etching. The spacing between the openings 104 can be adjusted during nanoimprint or EBL—typical values are 400, 600, 1000 or 2000 nm. The opening diameter is defined in the nanoimprint or EBL lithographic process, with typical values between 50-400 nm, depending on the used lithography technology. By means of suitable process steps, e.g. as described with reference to steps a) to e) above, a GaN seed 105 may be grown. Dependent on selected process parameters, the seed may evolve to nanowires 106 as in step f) or to volume elements 107 as in step g). Alternatively, the volume elements 10/may be created by radial volume growth on nanowires 106 grown in step f).

In one embodiment volume GaN growth or GaN nanowires are subjected to a coalescing/planarization step, in which a cohesive c-plane planar layer is obtained as shown in FIG. 1 i). In such an embodiment, the coalescing step may be carried out under a nitrogen-sustaining background condition using, for example, ammonia, while throttling or completely omitting column-III element-containing gas precursor as described above with reference to FIG. 1.

Figure 6A:
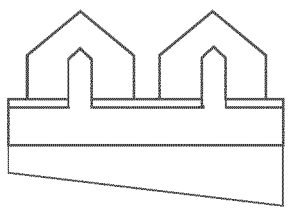
FIGS. 6A-C illustrate the formation of a coalesced GaN planar film prepared from discrete GaN nanowire growths.
Figure 6A:
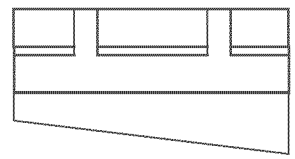
Figure 6A:
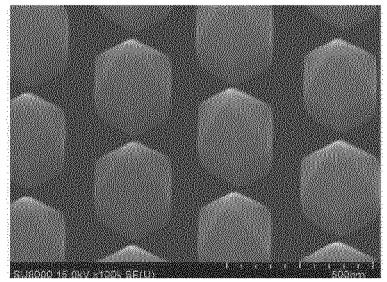

FIG. 6A shows volume growth structures as described in steps a-g.

The semiconductor structure having a plurality of individual volume growths (or nanowires) may be subjected to a subsequent coalescing step for merging the individual structures. The coalescing step may e.g. involve processing of the substrate at a temperature in the range of 1000-1200 degrees Celsius, with a high NH3 flow of 1-10 slm and absent any additional provision of Ga.

Figure 6B:
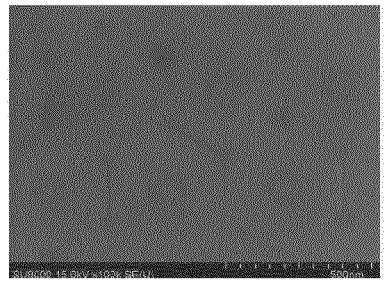
Figure 6C:
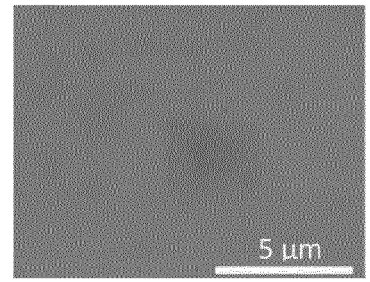

FIG. 6B shows a flat c-plane GaN surface after the coalescing step, in which it is observable that the individual growth structures flatten out and coalesce together. FIG. 6C shows a zoom out overview of larger area with uniformly coalesced GaN planar film. In the drawn figure above FIGS. 6B and C, it is indicated that the reformation has progressed such that the top of each nanowire is exposed to the planar coalesced surface. It should be noted, though, that in other embodiments planarization may be obtained by reformation only of the volume growth, such that a seed or nanowire grown prior to, and encapsulated by, the volume growth is not exposed.

A variant of the embodiment described with reference to FIGS. 6A-B may be to continue volume growth as shown in FIG. 6A until the individual growths merge to some degree, at least at the base close to the mask surface. In such an embodiment, the subsequent coalescing step will nevertheless cause reformation of the grown structures, so as to form a cohesive flat surface extending over the individual growth positions.

For individual growths from a patterned mask 103, the orientation of the nanowires or volume growths can be such that the side facets can be oriented in any of two in-plane orientations, i.e. in [1-100] or [−12-10]. While it would seem that merging of individual adjacent nanowires or volume growths would benefit from such adjacent growths having facing facets, the inventors have found that the flat c-plane GaN surface after the coalescing step can be formed in any of those two orientations. For example, in the planar semiconductor structure obtained in FIG. 6B, the originating nanowires are facing in [−12-1-0] with respect to each. The reformation process with mobile physisorbed atoms is consequently a suitable process for producing a cohesive planar semiconductor III-Nitride layer or film 109.

Figure 6D:
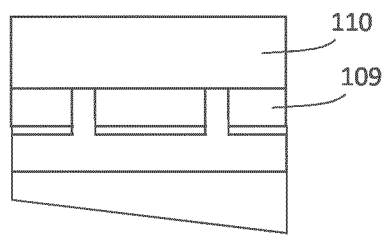
FIGS. 6D-E illustrate a subsequently grown GaN film layer on a coalesced GaN film.
Figure 6D:
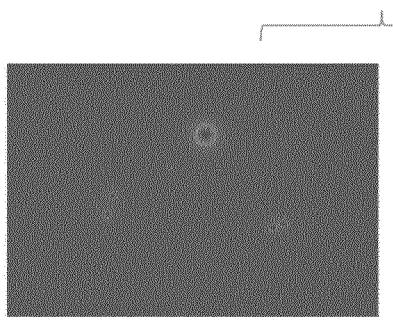
Figure 6E:
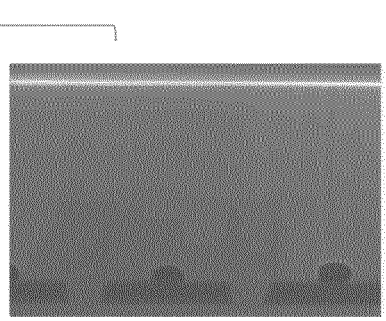

In one embodiment, a planar III-N film 110 can further be grown on the coalesced film 109. An example is shown in FIG. 6D by means of a SEM top view of a 500 nm thick planar GaN layer 110 that has been grown on the coalesced film 109, while FIG. 6E shows a cross-section SEM image of the structure.

Figure 7A:
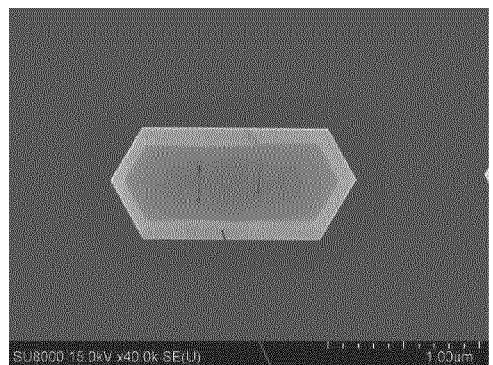
FIGS. 7A-C show examples of coalesced planar structures obtained by merging a plurality of separate volume elements.
Figure 7B:
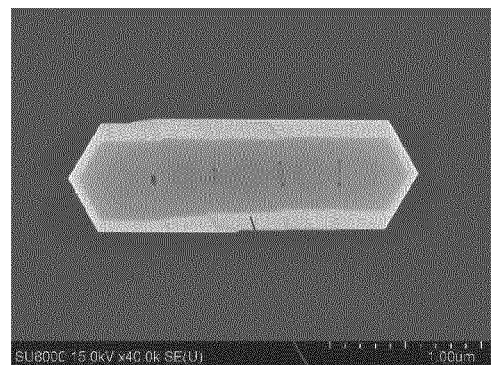

In accordance with one aspect, the inventors have found out that by controlling the coalescing step growth conditions it was possible to grow a coalesced planar layer from groups of two or more structures to form a larger platelet or mesa, e.g. compared to single structure mesas as in FIG. 2B. An example of such a structure is shown in FIG. 7A, which shows a triplet structure consisting of three volume growth structures, which have been coalesced into one planar platelet 701. FIG. 7B shows a variant, where five growths have been merged into one planar platelet 703. The ability to, in this way, form separate planar layers, designed in shape and size, gives the opportunity not only to fabricate wafers with separate insulated devices but also to provide the wafer with pre-deployed vias already at the wafer fabrication step. In one embodiment, a substrate may e.g. be configured with a mask 103 having a predetermined pattern of openings 104, distributed such that growth through the openings and subsequent coalescing will result in a desired shape of a planar semiconductor structure. In such embodiments, the volume GaN growth or GaN nanowires could be subjected to a radial volume enlargement growth step in order to make the decrease the gaps in between neighbouring nanowires or volume growth structures, but it is not necessary to for the purpose of obtaining the flat c-plane GaN surface.

Figure 7C:
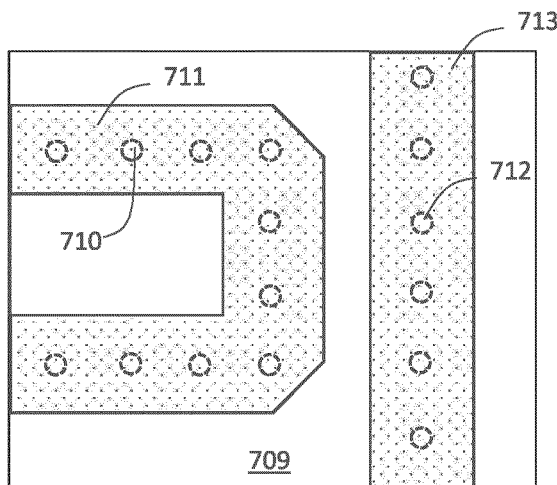

FIG. 7C illustrates, by way of a schematic example, a part of a substrate 709 provided with a mask having openings. In this embodiment, the openings are provided in an ordered manner, such that a first subset 710 of the openings form one pattern, and a second subset 712 of the openings form another pattern. After growth of semiconductor structures through the openings, e.g. in accordance with the preceding description, nanowires and/or volume elements will extend from the substrate surface through the openings 710, 712. In a step of coalescing, preferably carried out in situ in the same machine as used for growing and without intermediate removal of the substrate, the grown structures are subjected to operating conditions in which atoms are mobilized but kept attached, physisorbed, at the surface of the respective growth. In selected suitable conditions, as exemplified above for the steps of reformation and coalescing, the individual growths will flatten out, and closely adjacent growths will merge into a common planar layer. By arranging the openings in a manner such that certain growths will merge and certain will not, planar layers 711, 713 that are cohesive but also separate from each other may be formed. Such planar layers 711 and 713 may also assume a large variety of sizes and shapes. This provides a freedom of production that has hitherto not been available in the art of preparing planar III-N structures.

The coalescing step, as described brings a non-obvious advantage over, traditional, epitaxial methods of re-growth, such as ELO (Epitaxial-lateral overgrowth). Epitaxial regrowth is made under active growth-conditions with supersaturation as driving force. Crystallization from the gas phase reduces the free energy of the system, resulting in forced conditions where dislocations and defects can be formed, especially when non-aligned crystal growth fronts meet and coalesce, as in epitaxial regrowth and epitaxial overgrowth. In contrast, the reformation occurring during e coalescing step is carried out near thermal equilibrium.

During the planarization and coalescing step as described herein, no, or little additional column-III element is added to the epitaxial crystal. The epitaxial system is in a zero net-volume growth state but with conditions allowing for high surface mobility of physisorbed material. When dissociation- and chemisorption-rates are kept comparable, each physisorbed molecule is, ideally, free to repeatedly move, chemisorb and dissociate until it finds the lowest-energy crystal position to occupy. Dislocations in the crystal structure, as well as most defects results in a higher free energy, whereas the total binding energy to the crystal will be lower than in the case of the ideal crystal. All in all, making the planarization and coalescing step is much less prone to produce or comprise such crystal faults.

In one embodiment, the volume III-nitride growth is carried out with In or Al to obtain a flat c-plane InGaN or AlGaN surface. As a more specific example, a coalescing process applied for InGaN growth is described. In such a process steps a to d are included. Depending on step d array design coalesced planar InGaN layer or coalesced InGaN structure consisting of groups of two or more nanowires or volume growth structures could be grown, e.g. through steps e-g or e-f-g. By supplying In-precursor flow simultaneously with Ga-precursor flow during volume-growth ternary InGaN may be formed in step g) from e) or f). When the volume growth is subjected to the coalescing step i), both gallium and indium atoms are free to move, chemisorb and dissociate until they find low energy crystal positions. A planar InGaN coalesced layer is thus formed.

Figure 8A:
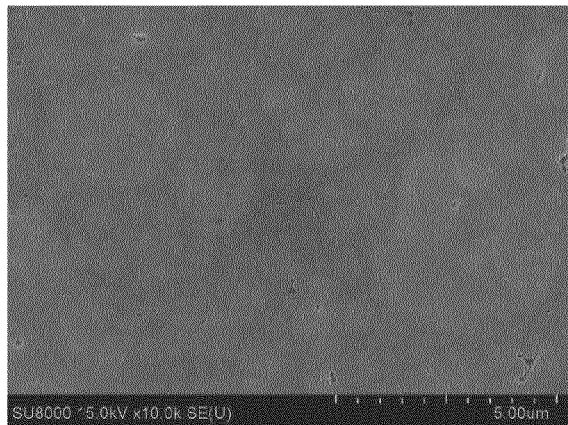
FIG. 8A shows an example of a coalesced InGaN layer.

An exemplary InGaN coalesced layer is given in FIG. 8A, in which a cohesive InGaN layer made from a plurality of merged individual growths of InGaN can be seen. In a preferred embodiment a repair planar InGaN growth can be carried out after the coalescing step, as described above with reference to FIG. 4. When doing so a planar InGaN growth will occur, on top of the coalesced layer. Since it is typically difficult to avoid defect formation and material degradation with higher indium, the method proposed herein provides an alternative growth technique where crystal faults are less prone to form. A planar InGaN layer, obtained by the proposed coalescing method, with reduced dislocation density will provide a very good substrate for optoelectronic device applications. It could be also directly used in typical CVD or VPE growth of III-nitride optoelectronic devices.

Figure 8B:
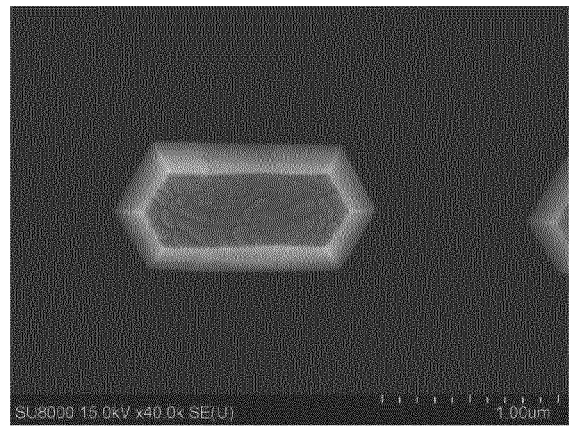
FIG. 8B shows an example of a coalesced InGaN structure formed from a group of three separate growths.

FIG. 8B shows an alternative embodiment of volume III-nitride growth with In or Al, developed to obtain a flat c-plane InGaN or AlGaN surface formed from a group of three openings in $SiN_x$ mask. The structure of FIG. 8B is similar to the structure of FIG. 7A, in that a limited number (three in this example) of ordered growths are coalesced into a via. The structure of FIG. 8B has not, yet, been provided with a repair layer, as evidenced by the surface structure which is characteristic for a transformed InGaN structure. In order to obtain the structure of FIG. 8B, a mask structure as shown in d) is selected, where the number, order and spacing of openings 104 are carefully selected. In step e) groups of two or more nanowires or volume growth structures could be formed. By introducing additional indium precursor flow during volume growth indium content in the volume growth g) can be added. When the volume growth is subjected to a coalescing step i) nanostructures or volume growth are coalesced, i.e. merged and made to form an increased c-plane surface. In one preferred embodiment, a smoothening InGaN growth layer can be grown out after the coalescing step, in a surface repair step.

The embodiments of FIGS. 7A and B and 8B illustrate examples of a semiconductor structure comprising a substrate, a mask provided on a surface of the substrate, the mask having a plurality of openings provided in an ordered manner along the substrate surface, wherein a cohesive planar via of a III-N material extends over a plurality of openings in a substrate mask. The planar via is formed by merged individual semiconductor structures grown through different openings. The openings may be provided at equidistant positions along a path along the substrate surface. The coalescing step may be carried out in situ in a subsequent step to individual semiconductor growth, wherein atomic reformation is carried out at an increased temperature with a high back pressure of nitrogen, without or with substantially no additional source of column III semiconductor material.

The solutions outlined above, for providing flat structures of III-N semiconductor material, such as e.g. GaN and InGaN, in the form of platelets or even coherent flat layers is a great and also unexpected achievement. It is now 100 years since the so-called Czochralski process was invented, according to which a solid crystal is slowly pulled up from a melt. This is still the basis for growth of Si ingots. Other, similar, techniques used for fabrication of conventional semiconductors, such as Ge, GaAs, GaP and InP, are the Bridgman technique and the float zone process. These technologies all have in common the use of a liquid/solid growth front, with a minutely controlled growth rate and temperature gradient, $\Delta T$, and initiated from a dislocation-free crystal seed. In these growth processes, $\Delta T$ will determine the growth rate, with a high $\Delta T$ forcing fast condensation of the crystal. In the Czochralski process the "Perfect Si Crystal" conditions are met when the growth rate is sufficiently fast as to avoid creation of Si crystal vacancies, but sufficiently slow, or unforced as to avoid incorporation of interstitial Si. In Czochralski growth, a low $\Delta T$ gives a low driving force for precipitation and the system is said to be close to thermodynamic equilibrium. In thermodynamic equilibrium, the atoms have the same probability for precipitation into the crystal from the liquid phase as for dissociation from the crystal phase to the liquid. In this case other factors will determine where the atoms go in the end. It is easy to realize that interstitial incorporation of atoms, or inclusions of vacancies represent a smaller decrease in free energy for the system than incorporation of adatoms at their respective lattice sites.

Figure 9A:
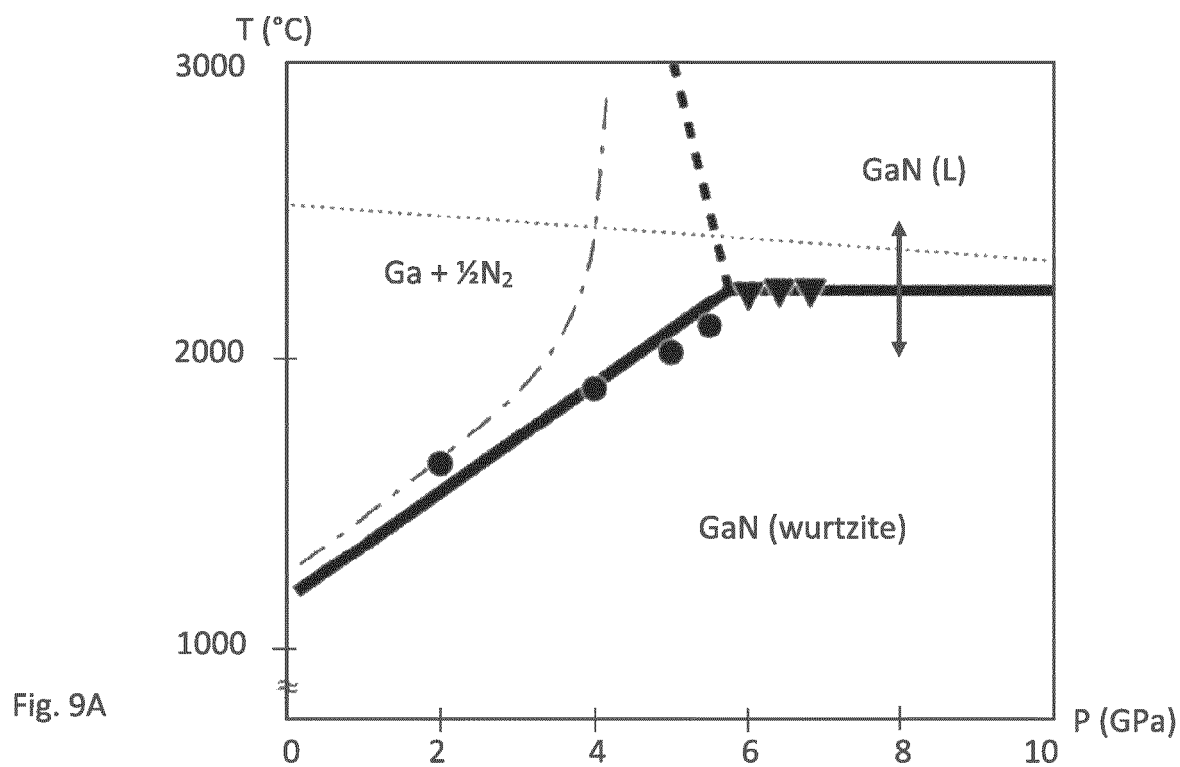
FIGS. 9A-C illustrate various Ga—N binary phase diagrams.

With reference to FIG. 9A, the Czochralski process is a transition between liquid phase and the crystal phase, represented by the double-headed arrow. However, as seen from the diagram, a phase boundary between solid and liquid GaN emerges only at pressures above 6 GPa. This makes liquid phase epitaxy of GaN an immense challenge with GaN semiconductor wafers instead predominantly fabricated on foreign substrates, by metal organic vapor phase epitaxy (MOVPE). In order to improve the crystal quality of GaN grown on sapphire and Si, epitaxial lateral overgrowth (ELO) has been developed in order to reduce dislocation density and provide higher quality substrates, and early results did show much promise and lately it has been adopted for nanowires.

In various embodiments of the solutions proposed herein, though, the epitaxial physics of a peculiar epitaxial regime is explored, which is denoted crystal reformation herein. This crystal reformation may be carried out as a step of planarization of a III-nitride material grown on a seed at a mask opening, as outlined for several different embodiments above. The planarization of the III-nitride material serves to form a plurality of discrete base elements having a substantially planar upper surface. Crystal reformation is performed near equilibrium conditions and supersaturation is not created by addition of material. In contrast to MOCVD growth in general, it's not required to supply the III-V nitride crystal growth front with column III-material in order to drive the phase transition. One significant aspect of equilibrium growth and the described method is reversibility of the phase transition, i.e. the ability to reverse the propagation of the growth front, going forwards or backwards, by changing the thermal bias. In our case the thermal bias, driving the reformation, is supplied by the difference in surface energy of the crystal facets: Net atomic dissociation at one crystal facet takes place simultaneously with net precipitation, or crystallization, at another facet. In this sense the epitaxial growth front comprises all involved facets but local growth rates may be both positive or negative.

In various embodiments, a supply of $NH_3$ is kept in order to avoid degradation of the crystal surface, and the temperature is elevated, as exemplified for various embodiments. In yet another embodiment for GaN, the elevated temperature may be in the range of 900° C. and 1200° C., or between 700° C. and 1000° C. In one embodiment the elevated temperature is above the sublimation temperature of the crystal material. During the reformation, the inventors have observed the surprising effect that a substantial portion of the crystal is transferred from one facet to another.

Figure 9C:
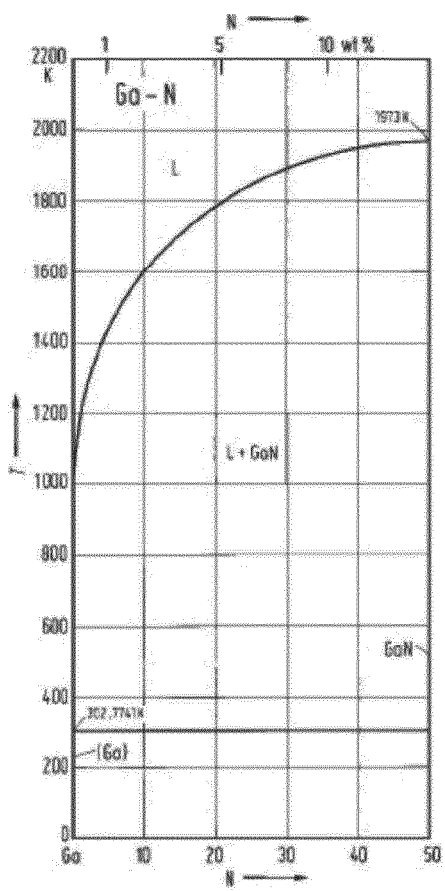
Figure 9B:
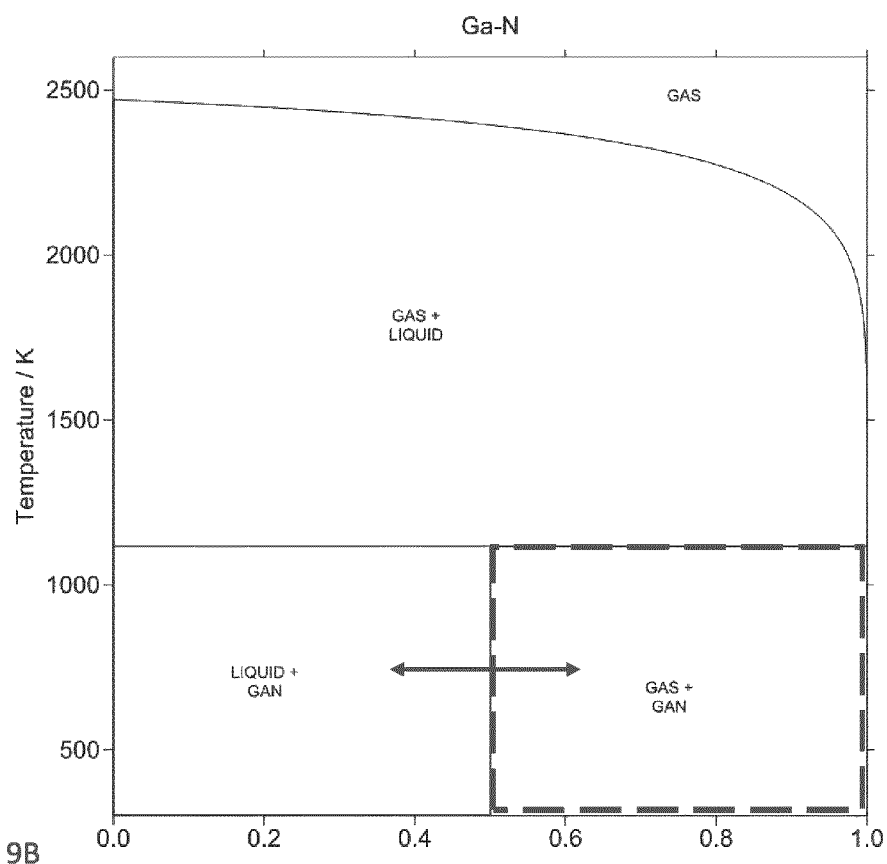

FIG. 9B illustrates a calculated Ga—N phase diagram at atmospheric pressure. Here it may be noted that the Gas+GaN regime, where the reformation step would be positioned, marked by dashed lines, requires an excess of atomic nitrogen and that Ga would be in liquid form. Furthermore, FIG. 9C shows the known Ga—N binary phase diagram according to Subvolume F 'Ga—Gd—Hf—Zr' of Volume 5 'Phase Equilibria, Crystallographic and Thermodynamic Data of Binary Alloys' of Landolt-Börnstein-Group IV Physical Chemistry. As noted therein, "An experimentally determined phase diagram is not available". This goes to show that hitherto there is in fact not sufficient experimental data to draw the phase-diagram for N>50%, The phase diagram corresponding to the reformation-conditions is not available. Although the environmental conditions suggest Ga to be in liquid phase, as the data suggest an additional condition of a low desorption—rate of the Ga atoms within the process window. The solutions proposed herein, for providing planar III-N materials by reformation, consequently form a new solution with beneficial, unexpected results, obtained by processes carried out in an untrodden territory of physics.

The shape-transformation is most likely driven by the surface energies of the facets. Growth on higher order facets are favored, such that formation of lower order facets and the 0001 c-plane is strongly favored, as can be anticipated from published work on kinetic Wulff crystal shapes in GaN. The kinetic Wulff model aims to predict the shape of a small crystal based on the relative surface energy ratios of the facets. The inventors propose to complement this model with an atomic picture, which may be associated with the embodiments described herein:

1. Each atom that dissociates from the crystal may stay in a physisorbed state or desorb to the gas-phase. Since the volume of the crystal remains intact, it may be concluded that desorption can be discounted and the atoms remain physisorbed until they are incorporated to the crystal again.

2. The probabilities for going into a physisorbed state and into a crystal-bound state are both high, but with a higher incorporation probability at the side facets and a higher desorption probability at the top facet (since the crystal height decreases). With high sticking and dissociation probabilities the atoms may alter freely between physisorbed states and crystal bound states. Formation of dislocations, point-defects, vacancies and interstitials usually results in a weaker bonding to the crystal and smaller decrease in free energy of the system than the positioning on a "perfect lattice site". Since the atoms can move freely between crystal-bound states, the atoms will typically end up at the positions with higher binding energy, and there will thus be a barrier to form a defect or dislocation, as compared to bonding at a "perfect site".

3. The physisorbed atoms are preferably column-III atoms, most common species being Gallium, Indium, and Aluminium. The natural state for these materials at the conditions used is liquid form (Room pressure melting T: Ga 30° C.; In 157° C.; Al 660° C., all having boiling Ts above 2000° C.). Their vapor pressures are all low, below 1 pascal at 1000° C., explaining the low loss of material through evaporation, although some evaporation-loss will be expected.

4. The physisorbed column III atoms can have rather high diffusion rates and diffusion lengths on the order of 1 μm for Ga and 10 μm for In. A good physical description is the physisorbed atoms forming a two-dimensional cloud on the surface which will retain a constant concentration within the limits of diffusion lengths which in various embodiment is larger than the dimensions of the template structures. The cloud is supplied by dissociation of column III atoms from the crystal lattice and the reformation rate will be given by the relative differences in atomic dissociation rate and sticking rate to the respective facets. As long as the reformation-rate is sufficient low for the surface-diffusive state of column-III material to retain a relatively constant, conformal concentration of column-III material and the dimensions of structure is of similar, or less, length than the diffusion-length, then the supply of III-material will not be diffusion-limited but crystal incorporation is only governed by the activation energy of the crystal binding. This is what usually is referred to equilibrium conditions.

5. In a preferred embodiment, the background flow of $NH_3$ will be sufficiently high when it provides a supply of nitrogen, e.g. through pyrolysis of $NH_3$, which is sufficient to provide a reservoir of nitrogen for III-material atoms to combine with during the reformation, at which a substantially planar upper surface is formed on a template facet. Pure nitrogen, N2, is inert at the used temperatures but the moderate activation energy for pyrolysis of $NH_3$ supplies us with enough atomic nitrogen to allow us to work with a phase transition touching on the right end side of the diagram in FIG. 9C. However, nitrogen sources with even lower cracking temperatures would allow for reformation at lower temperatures and possibly better control over incorporation of crystal nitrogen vacancies.

As noted, the planar upper surface will be formed and increased by redistribution of column III material, e.g. Ga or In, caused by favored growth on other template facets. At such a supply level, the nitrogen supply will not be diffusion limited, thereby fulfilling the condition for equilibrium growth with regards to the column V-element. Increasing the flow above this level may inhibit surface diffusion of column-III material productive flow of $NH_3$. It's more likely that atomic nitrogen supply is limited by low pyrolysis-rate of $NH_3$. Therefore the reformation step can be a very good candidate for use of alternative nitrogen sources where more efficient pyrolysis can be achieved. There are several such sources, examples being hydrazine, methylated hydrazine, such as dimethyl hydrazine, tertiarybutylhydrazine, tertiarybutylamine and also nitrogen-plasma, although reactivity of nitrogen radicals could decrease diffusion lengths appreciably.

Although using a gas phase environment, crystal reformation stands in closer relation to the original liquid phase epitaxy methods that have been the centennial state of the art of high-purity bulk-grown semiconductor wafers. The thermodynamics involved also suggest that the conditions for reformation can be made uniquely preservative, allowing for minimal introduction of new dislocations during the coalescence. Being a new epitaxial regime, this will, as is the case for all new epitaxy methods, require further understanding of the physics involved in order to avoid introduction of new crystal defects. The approach, detailed herein, relies on a combination of epitaxial growth, low temperature optical characterization and the implementation of a physical growth-model.

The nanostructures proposed herein are preferably all based on GaN nanowire seeds, or pyramidal seeds but other compositions of nitride material, including In and Ga can be used. The suggested embodiments are different, mainly due to specific challenges in context of materials and structures grown. Growing high Al composition AlGaN on GaN or high In-composition InGaN on GaN introduce crystal lattice mismatch, therefore the GaN seeds and templates are kept small in size to more easily accommodate strain without introducing new misfit dislocations. It may be even better but more challenging to incorporate In or Al, already during nanowire growth. Also, it may be preferable to use an AlGaN NW or grow and reform an AlGaN template directly. This is currently challenging due to the low diffusion-length of Al atoms but maybe preferably long term when such working conditions can be developed. With that said we should distinguish practical differences between GaN, InGaN and AlGaN methodology from fundamental preferences. All embodiments described may work may work for any combination of nitride material, as ternary nitride NW growth and reformation are further developed.

A great advantage is the elimination of substrate dislocations through the nanowire or seed growth, giving fully dislocation-free platelets. This gives a second similarity to the Czochralski process, since it generates high quality crystals not only due to the well-controlled equilibrium-proximity, but also since it generates its own dislocation free seed.

The reformation of whole arrays of nanostructures, such as nanowire-based structures, provides additional structural advantages which will now be discussed.

Nanowire-based structures provide vertical m-planes, [10-10]. These planes provide surfaces for efficient lateral coalescence of material rearranged from the top of the nanowire structures. As previously outlined, it has been noted that physisorbed column III atoms may form a two-dimensional cloud on the surface, when the nanowire-based structure is subjected to an elevated temperature in a Nitrogen-rich environment as exemplified, which cloud will retain a constant concentration within the limits of diffusion lengths of the physisorbed atoms. This may result in reformation, at which a C plane, directed upwards from the nanowire structures, tends to increase while III-nitride material instead grows on the m-planes.

In various embodiments the coalesced layer will thus be formed by formation of material in between the nanowire structures and, depending on process parameters such as temperature, and chosen length and spacing between the nanowire structures, the reformation will form a thin coalesced layer. More specifically, the reformation will cause growth between the nanowire structures adjacent upper portions of the nanowire structures. The result will be a coalesced layer which is thinner than the remaining length of the nanowire structures, leaving an appreciable lower part of the nanostructures un-coalesced. An example associated with this embodiment will now be described with reference to FIGS. 10 and 11.

FIG. 10 schematically illustrates method step of the production of a III-nitride semiconductor device, corresponding to the process described with reference to FIG. 1.

Figure 10A:
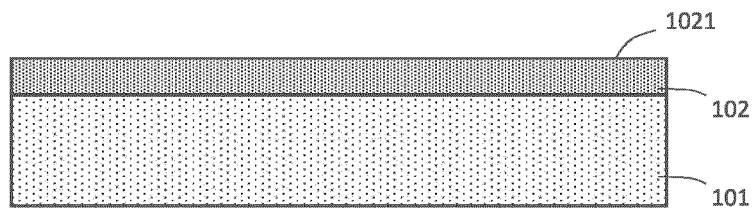
FIGS. 10A-D illustrate the formation of a nanowire structures for use in a method for making a semiconductor device having a planar layer.

In FIG. 10A a base substrate 101 of e.g. sapphire is provided with one or more buffer layers 102 of e.g. GaN. Together, the layers 101 and 102 form a substrate, with a substrate surface 1021.

Figure 10B:
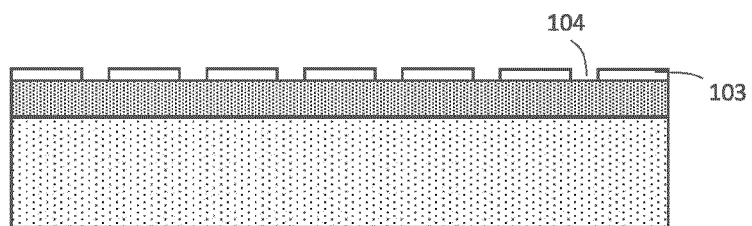

In FIG. 10B a mask layer 103 of e.g. $SiN_x$ has been formed on top of the substrate, which mask layer comprises apertures or holes 104. The holes may be very narrow, e.g. with a diameter of 50-200 nm, or e.g. 60-100 nm. The pitch between the holes 104 may e.g. be in the order of 200-2000 nm, e.g. 400-1000 nm, and is selected dependent on inter alia the electronic devices to be formed on the templates which are to be created on the substrate, and may also depend on the material of the III-nitride.

Figure 10C:
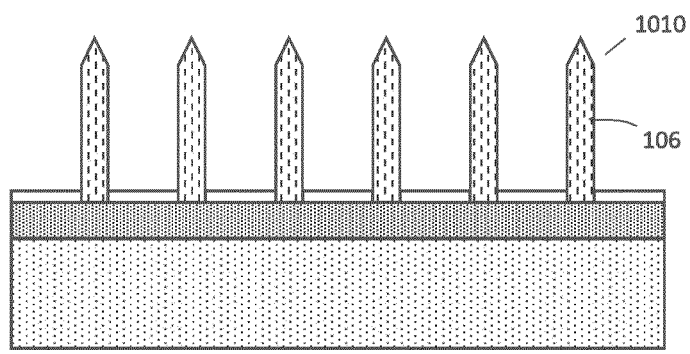

FIG. 10C illustrates how nanowires 106 have been grown on the substrate surface 1021 of the buffer layer 102 through the holes 104, e.g. by CVD or VPE in a nanowire growth step, wherein a nitrogen source flow and a metal-organic source flow are present. In one embodiment, the nanowires 106 comprise GaN.

Figure 10D:
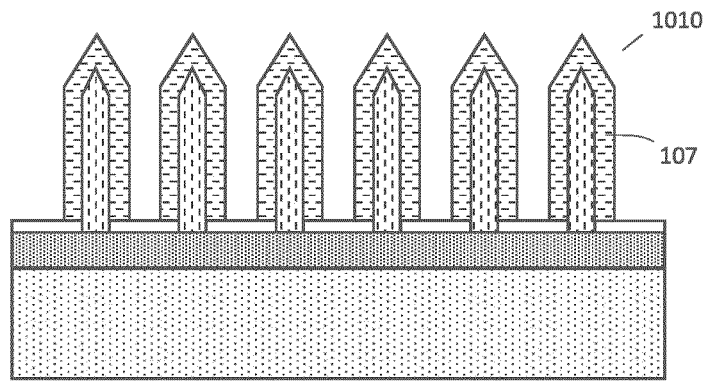

FIG. 10D illustrates the result of a volume growth step to provide a volume element, carried out after nanowire growth, as previously discussed herein. In the drawings, a different pattern is indicated for the nanowires 106 than the volume element 107, but is should be noted that this only serves the purpose of clearly showing the different elements.

The nanowires 106 and the volume element 107 may be provided in the same material, or different materials, as previously outlined.

For the embodiment at hand, the volume growth step is optional, but may be advantageous. As a result of the processes ending at FIG. 10C or 10D, a nanowire structure 1010 is formed, which comprises a nanowire 106 and optionally a volume element 107 provided onto the nanowire 106. It is a noted advantage that the nanowire structures are close to each other, with a pitch and width that results in a spacing between the nanowire structures which is substantially smaller than the length of the nanowire structures 1010. However, growing relatively narrow nanowires 106 will increase the positive effect of minimizing threading dislocations, which means that it may be more advantageous to provide a volume element 107 onto the nanowires 106 may be more beneficial than growing thicker nanowires 106. In one embodiment, the nanowire structures 1010 are grown to have a height which is at least 3 times a width of said spacing. In another embodiment, the nanowire structures are epitaxially grown to have a height which is at least 4, 5 or 6 times a width of said spacing.

Figure 11:
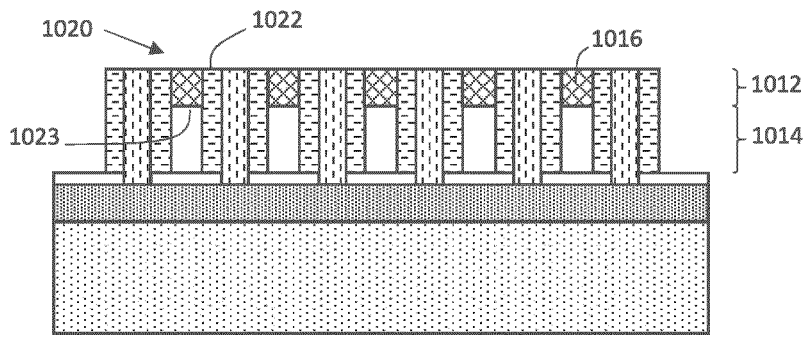
FIG. 11 shows an embodiment of a semiconductor device including a nanostructure comprising a planar layer of a III-nitride semiconductor crystal.

FIG. 11 illustrates a coalesced device formed after a planarizing step, carried out on a device including nanowire structures 1010 as shown in e.g. FIG. 10C or FIG. 10D. By carrying out the step of reformation on extended nanowire structures 1010, with a suitably small distance between each other compared to the length of the nanowire structures 1010, coalescence will appear at an upper part 1012 of the nanowire structures 1010 to form a coherent planar layer 1020, having an upper first surface 1022, and a backside surface 1023. As noted, the growth of the layer 1020 is carried out at an elevated temperature in a nitrogen-rich environment without, or substantially without, providing further column III material. Instead, due to distinctive different surface energies of the crystal planes, column III atoms are released from primarily the top portions of the nanowire structures 1010, so as to form and increase a C plane. Under suitable process parameters, as exemplified, such released column III material will attain a physiorbed and will further crystallize with nitrogen atoms to form a column III-nitride layer 1016 on the vertical M planes. This reformation will subsequently lead to coalescing of the M planes of adjacent nanowire structures 1010 to form the coherent layer 1020. Due at least in part to the larger length of the nanowire structures 1010 than the distance between the nanowire structures 1010, as given by the pitch and width of the nanowire structures 1010, coalescence into a coherent layer 1020 will take place primarily or only at an upper part 1012 of the nanowire structures 1010. A lower part 1014 of the nanostructures may thus remain un-coalesced, and free of solid material, or at least not occupied by material redistributed by coalescence from the nanowire structures 1010. Since column III material grown 1016 on the M planes at coalescence is taken from the top of the nanowire structures 1010, the resulting height of the nanowire structure is smaller after reformation.

The coalesced layer 1020 will hence be formed by formation of material in between the nanowire structures 1010 and forms a thin layer 1020. The depth of the coalescence 1016, which basically defines the thickness of the coalesced layer 1020, depends inter alia on chosen length of and spacing between the nanowire structures 1010. In various embodiments the coalesced layer 1020 may have a depth between 100 nm and 500 nm, but dependent on dimensions and process parameters this may be decreased to a range between 10 and 100 nm, leaving the lower part 1014 of the nanostructures un-coalesced. In various embodiments the coalesced portion 1016 may be in the range of half the resulting length of the nanowire structures 1010, such that the upper portion 1012 is between 20-70% of the resulting length of the nanowire structures 1010 after coalescence.

As discussed earlier, the reformation method provides better conditions for formation of a continuous layer with low generation of dislocations at the coalescing interfaces. In addition, reformation allows a thinner continuous layer to be realized than the nanostructures being epitaxial overgrown, through ELO, since planarization through ELO must be achieved by adding material on pyramidal and lateral surfaces of the nanostructures. It's also easy to see that similar nanostructures grown without a nanowire, mainly terminated by pyramidal –s-planes and c-planes, lack the prolonged vertical m-plane facets, enabling efficient lateral reformation.

Figure 12:
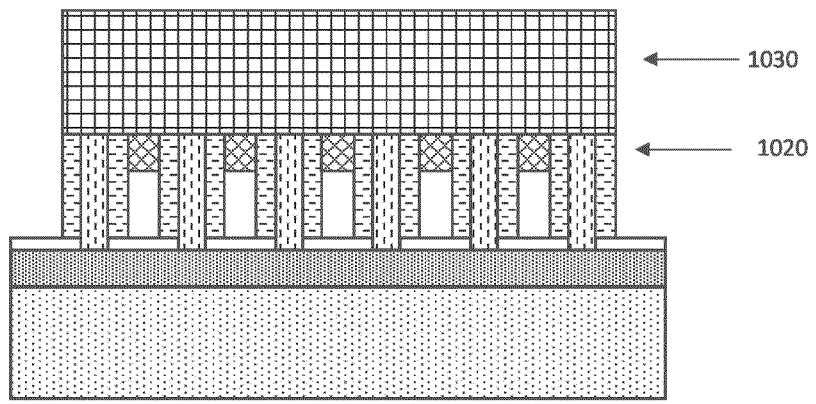
FIG. 12 shows an embodiment of a semiconductor device of claim 11, provided with an additional layer.

FIG. 12 shows an embodiment in which a subsequent layer 1030 is provided on top of the planarized and coalesced layer 1020. This layer 1030 may serve to provide a c-plane surface repair growth if required, or simply to provide thickening of the coalesced layer 1020. This step may be performed at a lower temperature than the planarizing step. In various embodiments, the surface repair growth may be performed by providing a supply of column III material, preferably the same column III material as in the planarized second III nitride material, and may result in additional layers of pyramidal growth. In preferred embodiment, the repair layer thus created may only include one or a few atom layers, such that there will be no substantial decrease of the planarized template surface. Further layers may be grown on top of a repair layer. Subsequent steps may include forming a device, such as an electronic component, in or on the planarized and coalesced plurality of base elements, on top of the subsequent layer 1030, e.g. by further epitaxial growth.

Figure 13A:
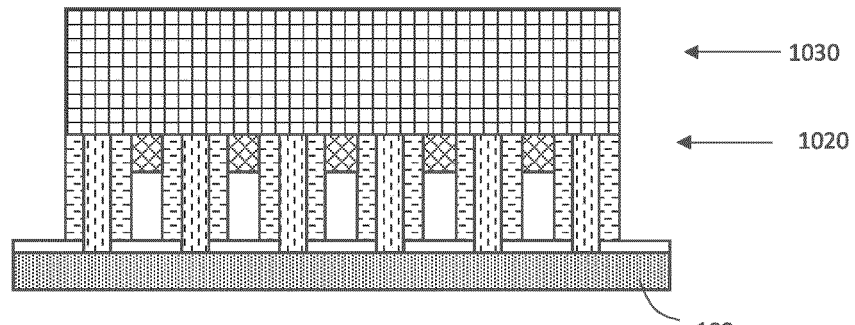
FIGS. 13A and B illustrate further processed semiconductor devices of the embodiment of FIG. 12.

FIG. 13A shows an embodiment provided by Flip-chip technology, in which the epitaxial stack is separated from the base substrate layer 101, while leaving layers from the growth-substrate 102, such as a GaN buffer layer. from the growth-substrate 102 the stack may also.

Figure 13B:
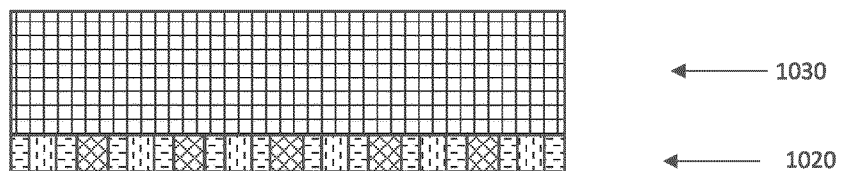

FIG. 13B shows another embodiment provided by Flip-chip technology, in which the epitaxial stack is entirely separated from the substrate 101, 102, and also the mask layer 103.

Figure 14:
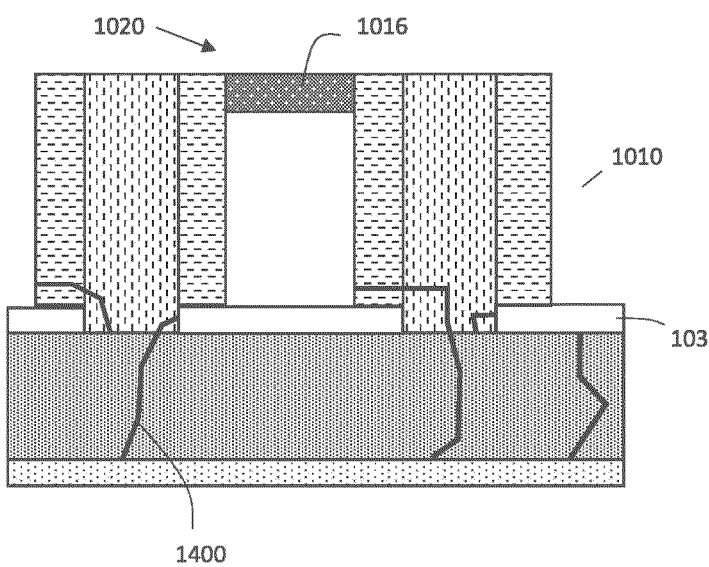
FIG. 14 illustrates threading dislocations in a semiconductor device.

FIG. 14 illustrates a beneficial effect rendered by the embodiments described with reference particularly to FIGS. 10-13. As already noted, by growth from mask holes 104, which represent a very small portion of the substrate surface, a large majority of any dislocations, such as threading dislocations 1400 illustrated in the drawing, in the substrate III-nitride 102 are filtered out by means of the mask layer 103. In addition, it has been noted that threading dislocations close to the edge of a hole 104 tend to bend off towards one side of the grown nanowire 106, or to the side edge of the mask hole 104. An explanation for this may be that strain generated by threading dislocations in the grown material tend to be released by growth of the nanowires 106, since the material in the nanowire 106 is substantially free to relax in three dimensions, as compared to the III-nitride material in the planar grown buffer layer. Both a thicker mask layer and longer nanowires may therefore provide an advantageous suppression or elimination of threading dislocations. More particularly, coalescing the nanowire structures 1010 at only an upper part, leaving a lower part of the nanowire structures 1010 separated, further minimizes the risk for threading dislocations to appear in the resulting coalesced layer 1020, and hence in any further grown layers 1030. The embodiments outlined with reference to FIGS. 10-14 may be provided with features of production and structure according to any of the other embodiments outlined herein, unless contradictory. As an example, devices with two or more separate coalesced surfaces, as described with reference to FIG. 7 and b, may also be generated by means of coalesced layers as indicated in FIG. 11.

Various embodiment of a device as shown in FIGS. 11-14 may be provided by means of a mask 103 of a spacing of e.g. 150-1000 nm, such as 700 nm, between mask holes 104 with an aperture of 50-300 nm, where larger apertures may be used with larger spacing. such as 200 nm. The nanowires 106 may be grown on a III-nitride buffer layer 102, such as GaN. Nanowires 106 may be grown to a height of e.g. 400-1000 nm, or even several µm. A nanowire structure 1010 may be provided with a narrow spacing, e.g. in the range of 50-200 nm, as determined by the aperture pitch and the width of the nanowire structures 1010. This may be obtained by growing nanowires 106 very close to each other. In another embodiment, nanowires 106 are grown with a substantially longer pitch, and are subsequently widened in a subsequent epitaxial growth step to be provided with a volume element, as exemplified in FIG. 10D. Where the spacing is shorter than the height of the nanowire structures, the tendency to form a thin coalesced layer 1020 may increase. Dimensions and process parameters may be configured dependent on e.g. desired thickness of the coalesced layer 1020, or the size of the uncoalesced portion 104.

In one exemplary embodiment, a dielectric mask 103 with a pitch of 700 nm between holes 104 with an aperture of 200 nm is provided on a GaN buffer layer 102. Nanowires 106 are epitaxially grown through the mask holes 104, and are subsequently epitaxially provided with a volume element 107, to a height and width of the nanowire structures in the range of 600 nm. The spacing between adjacent nanowire structures 1010 are thus in the order of about 100 nm, which means that the height is in the order of 5 times the size of the spacing. A reformation step carried out without or substantially without addition of Ga atoms, as described, results in redisposition of Ga atoms from primarily S planes at the top of the nanowire structures 1010 onto M planes, at an upper part 1012 of the nanowire structures, and may result in adjoining 106 of adjacent nanowire structures 1010 into a coalesced coherent layer 1020, with a thickness of 200-400 nm, leaving up to 300 nm or more of uncoalesced lower parts of the nanowire structures 1010.

As discussed earlier, the reformation method provides better conditions for formation of a continuous layer with low generation of dislocations at the coalescing interfaces. In addition, reformation allows a thinner continuous layer to be realized than the nanostructures being epitaxial overgrown, through ELO, since planarization through ELO must be achieved by adding material on pyramidal and lateral surfaces of the nanostructures. It's also easy to see that similar nanostructures grown without a nanowire, mainly terminated by pyramidal s-planes and c-planes lack the prolonged vertical m-plane facets, which enable efficient lateral reformation.

In various embodiments a substrate has a growth surface, such as provided by a planar GaN buffer-layer on Si, SiC, or Sapphire substrate, and a dielectric layer deposited on the growth-surface. Through an array of apertures in the dielectric layer, III-N nanowire structures are monolithically connected to the growth substrate by epitaxial growth. Upper parts of the nanostructures are laterally coalesced to form an appreciably continuous, planar layer of a III-N semiconductor crystal, in level with the upper ends of the NW cores. Subsequent planar layers may be epitaxial grown on the reformed layer. Threading dislocations from the growth substrate or threading dislocations generated by the epitaxial hetero-interface formed between the III-N nanostructure and the growth substrate, are terminated at the interface between the nanostructure and the dielectric layer, or at a lower, un-coalesced part of the nanostructures.

Other III-nitride semiconductors share the challenges of equilibrium growth of wafer material with GaN. Wafer fabrication of these materials is further challenged by a wide variation of crystal lattice dimensions, non-overlapping windows of thermal stability and material solubility. However, the realization of semiconductor growth-wafers of AlGaN, InGaN, AlInGaN, InN, and AlN of high crystal quality is highly attractive, for realization of more energy efficient and higher performance components and circuits in several areas of applications, some of them being of RF and power electronics, UV-LEDs, red/green LEDs. The examples below focus on AlGaN wafer fabrication, a material highly relevant for realizing efficient UV-LEDs and high voltage power devices.

Various embodiments, as exemplified e.g. with reference to FIGS. 10-14, work well to illustrate certain advantages, achieved through improved mechanisms for relaxation of crystal strain and eliminating parts of the strain that is otherwise built up in conventional planar semiconductor growth and, which, inevitably results in plastic deformation of the crystal through dislocation-formation when a critical layer thickness is reached. The generic nature of the invention makes it possible to utilize the described methodology for other industrially relevant mismatched semiconductor systems, such as generic III-V semiconductors grown on Si, for integration of optical and high speed functionality with Si CMOS, but the experimental findings behind this invention have been made in work with III-nitride material and is, correspondingly, as such described: III-N substrates (and III-V substrates) of different choice of composition, such as the binary, ternary and quaternary nitrides, given by the chemical formulas $Al_xGa_{1-x}N$, $In_zGa_{1-z}N$, where $0 \le x \le 1$ and $0 \le y \le 1$, and $Al_xIn_yGa_{1-x-y}N$, where $0 \le x \le 1$, $0 \le y \le 1$ and $0 \le 1-x-y \le 1$.

In table 1, crystal properties of some nitride semiconductors and available growth-wafers are given. There are no obvious matches between the materials, also in-between the nitride semiconductors the heterostructure growth will result in plastic deformation, unless thin layers and moderate composition-changes are used.

TABLE 1

| Material | Lattice constant (c, Å) | Lattice constant (a, Å) | Lattice mismatch to GaN (%) | Thermal expansion coefficient ($a_a$, ×10−6K$^{-1}$) |
| --- | --- | --- | --- | --- |
| GaN | 5.18 | 3.19 | 0% | 5.59 |
| AlN | 4.98 | 3.11 | −3% | 4.15 |
| Al0.2Ga0.8N | 5.14 | 3.174 | −1% | 5.302 |
| InN | 5.69 | 3.53 | 11% | ? |
| Si | 5.43 (cubic) | | 17% | 2.56 |
| Al$_2$O$_3$ (Sapphire) | | | −16% | 7.5 |
| SiC—6H | | 3.07 | −3% | 4.2 |

Figure 15:
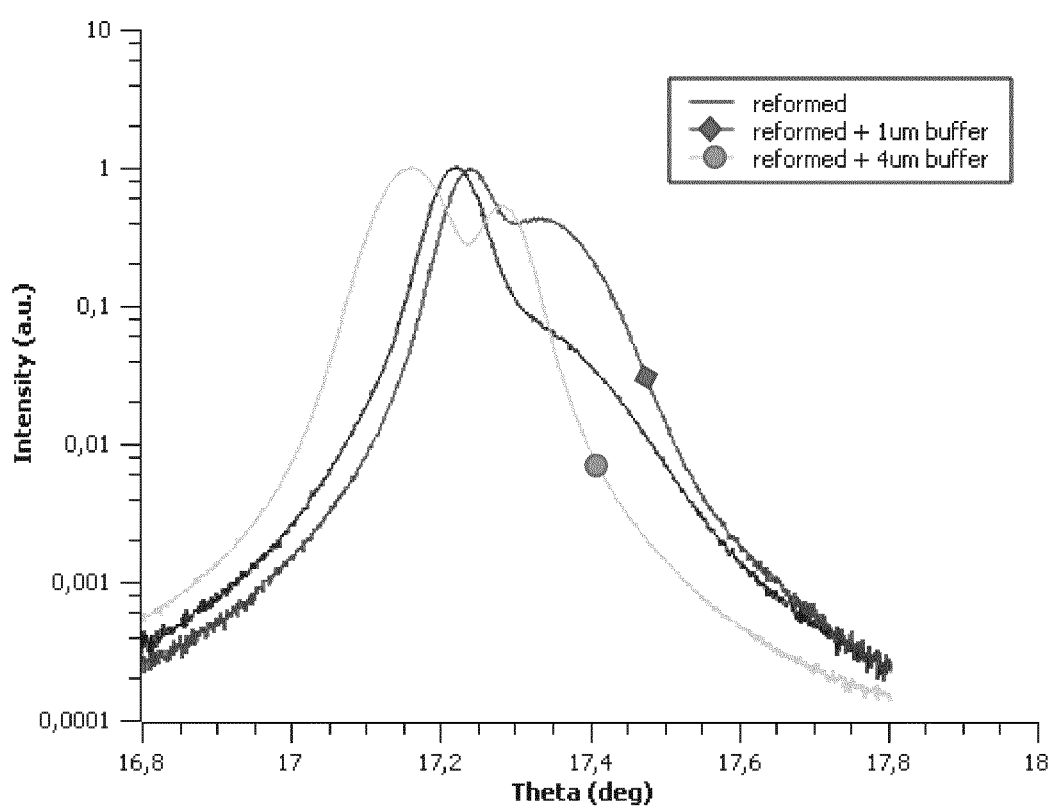
FIG. 15 illustrates x-ray diffraction (XRD) measurements of three different samples of coalesced planar layer fabricated on growth substrates according to various embodiments.

We have found that the structure, comprising a reformed planar layer monolithically connected by an array of pillars to a growth-substrate, such as exemplified by the embodiments of FIGS. 11-14, allow for a freedom of strain accommodation, as shown in FIG. 15. Table 2 provides data associated with the diagrams of FIG. 15.

TABLE 2

| Description | peak 1 θ (Deg) | peak 1 FWHM (arcsec) | peak 2 | peak 2 FWHM (arcsec) | $a_c$ (c-plane) peak 1 | $a_c$ (c-plane) peak 2 |
|---|---|---|---|---|---|---|
| NW + reformation | 17.22 | 244 | 17.34 | | 5.204 | 5.169 |
| NW + reformation + 1 μm top layer | 17.24 | 258.6 | 17.333 | 515.72 | 5.198 | 5.171 |
| NW + reformation + 4 μm top layer | 17.16 | 337 | 17.28 | 248 | 5.222 | 5.186 |

In FIG. 15, the diagram shows x-ray diffraction measurements of three different samples fabricated on growth substrates comprising an approximately 4 μm thick planar GaN buffer-layer 102 on a 600 μm thick sapphire wafer 101, similar to what was described with reference to FIGS. 1 and 10. All samples include a planar coherent layer 1020, coalesced from nanowire structures at upper ends, spaced from a growth substrate surface 1021 similar to the examples of e.g. FIGS. 11 and 12, i.e. where bottom ends of the nanowire structures adjacent to the growth substrate 101 are preferably uncoalesced and thus spaced apart. The three samples differ in that sample A, i.e. the first row in Table 2, comprise reformed nanowires to form a reformed or coalesced layer 1020, but without any additionally grown layers 1030. The reformed layer 1020 is approximately 0.3 μm thick. Sample B, corresponding to the second row in Table 2, has an additional 1 μm thick planar GaN layer 1030 epitaxially grown on the structure of sample A, while sample C, corresponding to the third row in Table 2, has an 4 μm thick planar GaN layer 1030 grown on the structure of sample A. The diagram of FIG. 15 shows the (0002) diffraction peaks in the regime of the GaN crystal diffraction peak. A fully relaxed GaN crystal, at room temperature, corresponds to a diffraction angle of 17.28°.

The planar GaN buffer layer 102 on the sapphire wafer 101 (peak 1, i.e. the dominant peak to the left in the respective curve) dominates the spectra of sample A and B, while staying fairly constant in position and linewidth, at 17.22-17.24° and 2.48-2.59 nm. The slight deviation from unstrained GaN (17.28°) is expected; a lower angle corresponds to larger lattice constant and the lattice mismatch between GaN and the sapphire substrate 101 which results in tensile strain of the GaN buffer layer 102. In sample C, the GaN buffer layer 102 peak (peak1) has shifted appreciably towards a larger lattice constant, as evidenced to the peak 1 shifted to 17.16°, which means a larger lattice constant. Also, the linewidth has increased, indicating a non-uniform strain field, or bow in the buffer layer 102.

The reason behind the additional tensile strain in the GaN buffer layer 102 in sample C is revealed by peak 2 (i.e. the rightmost peak or shoulder in the respective curve), which origins from the combined reformed layer 1020 and additional planar, epitaxial, layers 1030 grown on top of the reformed layer 1020 (sample B: 1 μm GaN and sample C; 4 μm GaN). Samples A and B exhibit the peak 2 as a shoulder around 17.33-17.34°, indicating a thin compressed GaN layer. When we increase the thickness of the epitaxially grown GaN layer 1030 to 4 μm, comparable to the GaN buffer layer 102 in the growth substrate, the diffraction peak 2 of 17.28° shows the top layer, meaning the combined coalesced coherent layer 1020 and additionally grown layer 1030. The location of this diffraction peak 2 at or close to 17.28° indicates that the combined layers 1020 and 1030 are essentially relaxed, unstrained. In the right columns of Table 2, related to FIG. 15, the XRD measurements are converted to lattice spacing (lattice constant=$a_c$). These values show that the difference in lattice spacing between the GaN buffer layer 102 and the GaN top layer 1020 and 1030 remains just below ~0.7% for the three samples, while GaN top layer lattice goes from ~0.35% to ~0% compression when increasing the layer thickness. Quite surprisingly, the lattice relaxation of the top layer seems to be accommodated by the introduction of a corresponding level of tensile strain in the already strained GaN buffer layer 102, going from ~0.35% to ~0.7% expansion. This not only shows that the structure can accommodate a lattice mismatch of at least 0.7% but also that the strain (and corresponding likelihood of plastic deformation) is distributed downwards, into the growth substrate 101, 102, allowing the top-layer 1020, 1030 to relax to a high degree.

Furthermore, it is easy to accommodate for the 0.7% lattice mismatch between the top layer and the growth substrate GaN buffer layer by incorporating Al into the top layer. Using Vegard's law and knowing that AlN has a 3% lattice mismatch to GaN we approximate a 0.7% lattice mismatch to correspond to 23% of Al. An $Al_{23}Ga_{77}N$ top layer 1030 would allow the crystal lattice of the GaN buffer layer 102 to approach the nominal lattice spacing or constant of fully relaxed GaN, eliminating internal strain between the top layer and the buffer layer.

And, even further, we have seen that the reformed structure can accommodate at least 0.7% lattice mismatch between the growth substrate (GaN buffer layer 102) and the top planar layer 1030 grown on the reformed structure 1020. It's reasonable to assume that the sign of the strain plays little role and that we can allow the introduction of an additional lattice mismatch of 0.7% from the relaxed structure comprising an $Al_{23}Ga_{77}N$ top layer 1030 and a GaN buffer layer 102. Using Vegard's law again, we aim at a 1.4% lattice mismatch as compared to a GaN top layer, giving that we can expect to be able to grow AlGaN with at least 47% Al without introduction of misfit dislocations in the top layer 1030.

The nitride semiconductors are typically wurtzite crystal structure and are anisotropic with different lateral constant (aa) and vertical lattice constant ($a_c$). The lattice spacings extracted from the XRD measurements in FIG. 15 are in the vertical c-direction ($a_c$). It would be prudent to corroborate the above findings and argumentation. To do this we go back to the top GaN layer 1020, 1030 and the GaN buffer layer 102, in order to understand how exactly a crystal mismatch between two layers of identical material is introduced. This is not obvious, in light of the whole reformed structure and the two GaN layers on top 1020, 1030 and bottom 102 forms a singular monolithically grown crystal plainly composed of GaN/GaN homojunctions.

A mechanism that is often forgotten in GaN layer on layer growth, is thermal expansion. This is understandable, since it mainly provides a challenge in the nucleation and initial growth for fabrication of GaN buffer layers on Si, and to much less extent on Sapphire and SiC, in order to avoid cracks and control thermally induced bow of the substrate 101. Thermal mismatch is fairly irrelevant in layer on layer growth on existing GaN buffer layers 102.

In the reformation process, i.e. during coalescence to form a coherent layer 1020 from a nanowire structure, thermal mismatch plays a unique role, and opportunity, distinctly different from to the challenges it provides in buffer layer 102 growth. The basis for this is that coalescence by reformation is a fully lateral process. The reformation and growth temperatures of GaN are typically 1000° C. above room temperature (RT). The same temperature may be applied during coalescence to form layer 1020 and growing the growth layer 1030, but with different flow of source material. In an alternative embodiment, a first elevated temperature applied during coalescence, or reformation, to form layer 1020 may be higher than a second elevated temperature when growing the growth layer 1030. Since the sapphire substrate 101 thickness used in FIG. 15 is 600 µm, while the GaN buffer layer 102 on top of the sapphire substrate 101, which forms the growth substrate surface, is around 4 µm, we can assume the combined substrate 101, 102 to expand according to the sapphire thermal expansion coefficients.

In Table 3, the thermal expansion along the GaN lateral direction is given. The embodiments outlined herein may relate to the fabrication of a semiconductor device having a planar III-N semiconductor layer, including coalescence at an elevated temperature T. Coalescence is preferably carried out above the sublimation temperature of the nanostructure 1010 III-N material, which may vary dependent on pressure. The temperature T may e.g. be in the range of 700-1500° C., or 800-1200° C., or 900-1100° C. The temperature T is elevated above room temperature RT, which may be in the range of 18-22° C., and exemplified as 21° C. in the example in Table 3. Thermal expansion affects the amount the distance between the mask apertures 104 will change when heating up the sample, and consequently the spacing between the NWs 106. Specifically, since the substrate comprises a comparatively thin buffer layer 102, of a III-N material, provided on a comparatively thick wafer of a different material, the thermal expansion of the wafer 101 will dominate the overall thermal expansion of the substrate. The buffer layer 102 may have a thickness in the order of 0.1-5% of the thickness of the wafer 101, or 0.5-2%, in various embodiments. In at least such embodiments, the overall thermal expansion coefficient of the substrate will substantially be the same as for the wafer material. Hence, the thermal expansion of the wafer 101, from RT to T, affects built-in crystal strain in the buffer layer 102 and causes an increase in said crystal lattice spacing at the growth surface, as caused by the heating, to deviate from a corresponding increase of a relaxed crystal of the buffer material. Since the GaN lateral expansion coefficient is lower than Sapphire, it will require a higher number of GaN monolayers, or periods of the atomic lattice, in the lateral direction to close the gap by coalescence between the nanowires 106, 107 at growth temperature than at room temperature. Hence, the number of lattice cells spanning the distance between adjacent apertures 104 are different at the growth surface compared to the number of lattice cells spanning the corresponding distance at the coalesced planar layer 1020. When the sample is cooled down, the substrate, and most importantly the sapphire material of the wafer 101, will shrink and the lattice of the reformed layer 1020 will be laterally compressed with respect to the sapphire with a change in lattice spacing of approximately 0.3% (0.28%).

TABLE 3

| Substrate type | substrate expansion from 294 to 1273K | spacing at RT (nm) | spacing at 1273K (nm) | GaN expansion Δa/a from 1273K to 294K |
|---|---|---|---|---|
| GaN on sapphire | 0.89% | 1000 | 1008.9089 | 0.28% |
| GaN on silicon | 0.44% | 1000 | 1004.4251 | −0.16% |
| GaN on SiC | 0.59% | 1000 | 1005.9091 | −0.10% |

This shows that, with the coalescing reformation process, the choice of growth substrate 101, in particular the thermal expansion coefficients, matters profoundly for growth of layers with different lattice size. With AlGaN, which is a smaller crystal than the GaN buffer layer 102, a substrate 101 like sapphire with a larger expansion coefficient than the intended AlGaN top layer 1030 allows growth of layers that are highly mismatched to said growth substrate surface material. If we want to grow InGaN as a top layer 1030, where the lattice size increases with increased In concentration, a substrate 101 like Si is preferable, since it has a much lower expansion coefficient than GaN and InGaN, meaning that at high temperature a smaller amount of periods of the atomic lattice in the lateral direction will fill up the space between the nanowires than at RT, resulting in a strain-accommodated lateral expansion of the crystal lattice in the top layer 1030 at RT with respect to the growth surface material, also referred to herein as the buffer layer material, i.e. the uppermost layer of the buffer layer 102.

Consequently, the embodiments above may comprise a continuous or coherent layer 1020, 1030 of a crystal lattice size that is larger than the crystal lattice size of a layer 102 of the growth substrate 101, 102 comprising the growth surface 1021, and where the growth substrate 101, 102 has an overall lower expansion coefficient than the continuous layer 1020, 1030, such as a GaN buffer layer on Si or SiC.

The embodiments may also comprise a continuous or coherent layer 1020, 1030 of a crystal lattice size that is smaller than the crystal lattice size of a layer 102 of the growth substrate 101, 102 comprising the growth surface 1021, and where the growth substrate 101, 102 has an overall higher expansion coefficient than the continuous layer 1020, such as a GaN buffer layer on sapphire.

In the above embodiments the transition to the composition of the top continuous layer 1030 can be made by growing a layer 1030 of the intended composition on the reformed coalesced layer 1020. When larger compositional changes and changes in lattice spacing are intended, it may be advantageous to use the radial growth step to grow a radial layer 107 of the intended composition on the nanowires 106, or a radial layer 107 approaching the intended composition, so that already the coalesced, reformed layer 1020 approaches the intended lattice spacing. It's also possible to start the compositional transition at the NW 106 growth-step.

There are several less common alternative substrate 101 materials that have been used for GaN buffer layer 102 growth. Two examples which can enhance the required difference in thermal expansion coefficient are $NdGaO_3$ with a lateral thermal expansion coefficient of $11.9*10-6/K$ and ZnO, with a lateral thermal expansion coefficient of $2.9*10-6/K$.

Various nanostructures and processes for preparing III-nitride semiconductor devices have been provided above, which devices are suitable for further processing to carry or incorporate semiconductor electronic devices, such as Schottky diode, p-n diode, MOSFET, JFET, HEMT etc. The planar substrate layer obtained by coalescing of individual growths from mask openings is substantially fully relaxed, as compared to a traditionally grown layer on a mismatched substrate, while microscopic and macroscopic strain may be induced by other environmental conditions, such as differences in the thermal expansion properties and high fabrication temperature, interface and surface energies and dopants or impurities. Further details on embodiments for fabrication of various such electronic devices can be found e.g. in the referenced patent application.

The invention claimed is:

1. A method of fabricating a semiconductor device having a planar III-N semiconductor layer, comprising:
   providing a substrate comprising a wafer, a buffer layer of a different material than the wafer, having a growth surface with a first lattice constant at the growth surface, and a mask layer on the growth surface, having an array of nanosized apertures;
   epitaxially growing III-N material in the nanosized apertures to form nanostructures, the nanostructures comprising at least one III-N layer with a second lattice constant,
   coalescing the nanostructures at an elevated temperature (T) to form a continuous layer, wherein the step of coalescing includes:
      releasing column III material from upper ends of the nanostructures; and
      filling out a spacing between the nanostructures by forming semiconductor material from the released column III material; and
   epitaxially growing a III-N growth layer on said continuous layer;
   wherein the III-N growth layer is configured such that thermal expansion between room temperature (RT) and T of the growth layer is different from the wafer; and
   wherein a number of lattice cells spanning a distance between adjacent apertures is different at the growth surface of the buffer layer and at the continuous layer.

2. The method of claim 1 wherein:
   the wafer is a Si or SiC wafer;
   the second lattice constant is smaller than the first lattice constant; and
   the number of lattice cells spanning the distance between adjacent apertures is lower at the growth surface of the buffer layer than at the coalesced layer.

3. The method of claim 1 wherein:
   the wafer is a sapphire wafer;
   the second lattice constant is larger than the first lattice constant; and
   the number of lattice cells spanning the distance between adjacent apertures is higher at the growth surface of the buffer layer than at the coalesced layer.

4. The method of claim 1, wherein the coalesced planar layer has a mean lattice spacing at the elevated temperature (T) which corresponds to its relaxed nominal lattice spacing at same T.

* * * * *